US012787513B2

(12) United States Patent
Peng et al.

(10) Patent No.: US 12,787,513 B2
(45) Date of Patent: Nov. 3, 2026

(54) DISPLAY MODULE AND DISPLAY DEVICE

(71) Applicant: BOE TECHNOLOGY GROUP CO., LTD., Beijing (CN)

(72) Inventors: Weiting Peng, Beijing (CN); Qian Wu, Beijing (CN); Wei Wang, Beijing (CN); Xianqin Meng, Beijing (CN); Fang Cheng, Beijing (CN); Yutong Yan, Beijing (CN); Dacheng Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 547 days.

(21) Appl. No.: 18/279,745

(22) PCT Filed: Nov. 30, 2022

(86) PCT No.: PCT/CN2022/135543

§ 371 (c)(1),
(2) Date: Aug. 31, 2023

(87) PCT Pub. No.: WO2024/113243

PCT Pub. Date: Jun. 6, 2024

(65) Prior Publication Data

US 2025/0015237 A1 Jan. 9, 2025

(51) Int. Cl.
*H10H 20/851* (2025.01)
*H10H 20/855* (2025.01)

(52) U.S. Cl.
CPC ...... *H10H 20/8514* (2025.01); *H10H 20/855* (2025.01)

(58) Field of Classification Search
CPC ............. H10H 20/8514; H10H 20/855; H10H 29/8552; H10H 29/872; H10H 29/30; H10K 59/38; H10K 59/879; H10K 59/8792
See application file for complete search history.

(56) References Cited

U.S. PATENT DOCUMENTS

| | | | |
|---|---|---|---|
| 10,338,415 | B2 | 7/2019 | Visser et al. |
| 2018/0172988 | A1 | 6/2018 | Ahmed et al. |

(Continued)

FOREIGN PATENT DOCUMENTS

| | | | |
|---|---|---|---|
| CN | 110164938 | A | 8/2019 |
| CN | 111628107 | A | 9/2020 |

(Continued)

OTHER PUBLICATIONS

Jia et al., CN 111682126, Sep. 18, 2020 (Year: 2020).*

(Continued)

*Primary Examiner* — Mary Ellen Bowman
(74) *Attorney, Agent, or Firm* — Dority & Manning, P.A.

(57) ABSTRACT

A display module is provided. The display module includes a light modulation layer, and the light modulation layer is located between a color film layer and a display substrate. The light modulation layer includes a plurality of modulation portions, and a modulation portion is correspondingly disposed between a light-emitting portion and a color film portion. The modulation portion includes a modulation structure and a transmission structure. The color film portion includes a first region and a second region. An orthogonal projection of the transmission structure on the corresponding color film portion is located within the first region. The second region is adjacent to another color film portion of a different color, and an orthogonal projection of the modulation structure on the corresponding color film portion is located in the second region. The modulation structure is used to converge exit light of the corresponding light-emitting portion.

19 Claims, 12 Drawing Sheets

(56) References Cited

U.S. PATENT DOCUMENTS

| | | | |
|---|---|---|---|
| 2018/0348548 A1 | 12/2018 | Visser et al. |
| 2020/0135703 A1 | 4/2020 | Ahmed et al. |
| 2021/0231845 A1 | 7/2021 | Wang et al. |
| 2022/0416195 A1 | 12/2022 | Zhang et al. |

FOREIGN PATENT DOCUMENTS

| | | |
|---|---|---|
| CN | 111682126 A | 9/2020 |
| CN | 113013268 A | 6/2021 |
| CN | 113130716 A | 7/2021 |
| CN | 113258016 A | 8/2021 |
| CN | 113471390 A | 10/2021 |
| CN | 113589535 A | 11/2021 |
| CN | 113640992 A | 11/2021 |
| CN | 114185174 A | 3/2022 |
| CN | 114678480 A | 6/2022 |
| CN | 114783289 A | 7/2022 |
| CN | 114815252 A | 7/2022 |

OTHER PUBLICATIONS

Ma et al., WO 2023/123113, Jul. 6, 2023 (Year: 2023).*
PCT International Search Report and Written Opinion (w/ English translation) for corresponding PCT Application No. PCT/CN2022/108672, dated Apr. 23, 2023, 11 pages.
U.S. Non-Final Office Action for corresponding U.S. Appl. No. 18/274,475, dated Jan. 23, 2026, 19 pages.

* cited by examiner

DISPLAY MODULE AND DISPLAY DEVICE

CROSS-REFERENCE TO RELATED APPLICATION

This application is a national phase entry under 35 USC 371 of International Patent Application No. PCT/CN2022/135543, filed on Nov. 30, 2022, which is incorporated herein by reference in its entirety.

TECHNICAL FIELD

The present disclosure relates to the field of display technologies, and in particular, to a display module and a display device.

BACKGROUND

A display device usually includes a display substrate and a color film layer for realizing color conversion. The display substrate includes a plurality of light-emitting portions, and the color film layer includes a plurality of color film portions. A light-emitting portion is disposed in correspondence to a color film portion, and adjacent color film portions have different colors.

SUMMARY

In an aspect, a display module is provided. The display module includes a display substrate, a color film layer and a light modulation layer. The display substrate includes a plurality of light-emitting portions. The color film layer is located on a light-exit side of the display substrate. The color film layer includes a plurality of color film portions, and the plurality of color film portions cover the plurality of light-emitting portions, respectively. The plurality of color film portions include at least two color film portions of different colors. The light modulation layer is located between the color film layer and the display substrate. The light modulation layer includes a plurality of modulation portions, and a modulation portion is correspondingly disposed between a light-emitting portion and a color film portion. The modulation portion includes a modulation structure and a transmission structure. The color film portion includes a first region and a second region. An orthogonal projection of the transmission structure on the corresponding color film portion is located within the first region. The second region is adjacent to another color film portion of a different color, and an orthogonal projection of the modulation structure on the corresponding color film portion is located in the second region. The modulation structure is used to converge exit light from the corresponding light-emitting portion.

In some embodiments, an orthogonal projection of the transmission structure on the display substrate completely covers the corresponding light-emitting portion.

In some embodiments, the transmission structure includes a vacuum layer.

In some embodiments, an orthogonal projection of the modulation portion on the display substrate coincides with an orthogonal projection of the corresponding color film portion on the display substrate.

In some embodiments, the modulation structure includes a metasurface structure. The metasurface structure includes a plurality of unit structures, and the plurality of unit structures are arranged in an array. Center lines of any two adjacent unit structures have an equal distance therebetween, and each unit structure has an equal height in a direction perpendicular to the display substrate.

In some embodiments, the plurality of unit structures are centrally symmetrical.

In some embodiments, a material of the unit structure includes silicon nitride.

In some embodiments, the metasurface structure further includes an isolation structure. The isolation structure is located between the plurality of unit structures, and a refractive index of the unit structure is greater than a refractive index of the isolation structure.

In some embodiments, a difference between the refractive index of the unit structure and the refractive index of the isolation structure is in a range of 1.03 to 1.3, inclusive.

In some embodiments, the modulation structure includes a first edge and a second edge that are oppositely disposed. The first edge is disposed proximate to the transmission structure, and the second edge is disposed away from the transmission structure. A distance between the first edge and the second edge is L and satisfies a following formula:

$$L = T2 \times \tan\,\theta.$$

Where L is the distance between the first edge and the second edge; T2 is a thickness of the color film portion corresponding to the modulation structure; and θ is an angle at which the modulation structure deflects light from the corresponding light-emitting portion, $\theta=\sin^{-1}(1/n)$, where n is a refractive index of the color film portion corresponding to the modulation structure.

In some embodiments, any of the plurality of unit structures has a different phase value. The unit structure includes a first column extending in a third direction, and a first column corresponding to any of the plurality of unit structures has a different size. The third direction intersects with the display substrate.

In some embodiments, a phase value of the unit structure is in a range of 0 to $2\pi(m-1)/m$, where m is a positive integer.

In some embodiments, the first column is a cylinder. A radius of the first column corresponding to any of the plurality of unit structures satisfies a following formula:

$$n_{eff} = \sqrt{n_1^2 - \left(\frac{U(r, n_2)\lambda}{2\pi r}\right)^2}.$$

Where $n_{eff}$ is an equivalent refractive index corresponding to the unit structure, and $$\varphi = \frac{2\pi}{\lambda} n_{eff} H,$$

where φ is a phase value corresponding to the unit structure, H is a height of the unit structure in a direction perpendicular to the display substrate, and λ is a wavelength of light from a light-emitting portion corresponding to the unit structure; $U(r,n_2)$ is a Bessel function related to r and $n_2$, r is the radius of the first column corresponding to the unit structure, $n_2$ is a refractive index of the unit structure; and $n_1$ is a refractive index of the isolation structure.

In some embodiments, coordinates of the first column corresponding to any of the plurality of unit structures satisfy the following formula:

$$\varphi(x, y) = \frac{2\pi n_2}{\lambda}(x + y)\sin\theta.$$

Where $n_2$ is the refractive index of the unit structure; $\lambda$ is the wavelength of the light from the light-emitting portion corresponding to the unit structure; $\theta$ is an angle at which the unit structure deflects the light from the corresponding light-emitting portion; x is a coordinate value of the unit structure on a first coordinate axis, and the first coordinate axis extends in a first direction; y is a coordinate value of the unit structure on a second coordinate axis, and the second coordinate axis extends in a second direction; a common origin of the first coordinate axis and the second coordinate axis is located at a midpoint of the modulation portion including the unit structure, the first direction and the second direction are both parallel to the display substrate, and the first direction intersects the second direction.

In some embodiments, the plurality of unit structures have same phase values. The unit structure includes a second column extending in a third direction, and a second column corresponding to any of the plurality of unit structures has a same size. The third direction intersects with the display substrate.

In some embodiments, the display module further includes an encapsulation layer. The light modulation layer is located between the encapsulation layer and the color film layer. The second column satisfies a following formula:

$$d(n_{in}\sin\theta_{in} \pm n_{out}\sin\theta_{out}) = m\lambda.$$

Where d is a distance between center lines of adjacent unit structures; $n_m$ is a refractive index of the encapsulation layer, and $\theta_{in}$ is an angle between light from a light-emitting portion corresponding to the unit structure and a normal; $n_{out}$ is a refractive index of the color film portion corresponding to the unit structure, and $\theta_{out}$ is an angle between light exiting to the corresponding color film portion and a normal line; m is a coefficient, and m=1; $\lambda$ is a wavelength of the light from the light-emitting portion corresponding to the unit structure.

In some embodiments, a ratio of a diameter of the second column to the distance between the center lines of two adjacent unit structures is in a range of 0.3 to 0.6, inclusive.

In some embodiments, the modulation structure is disposed around the transmission structure.

In some embodiments, the modulation structure includes a first sub-portion, a second sub-portion, a third sub-portion, and a fourth sub-portion that are connected end to end in sequence. The first sub-portion and the third sub-portion both extend in a first direction and are arranged opposite to each other in a second direction, and the second sub-portion and the fourth sub-portion both extend in the second direction and are arranged opposite to each other in the first direction. The first direction and the second direction are both parallel to the display substrate, and the first direction intersects the second direction. A width of the first sub-portion in the second direction, a width of the third sub-portion in the second direction, a width of the second sub-portion in the first direction and a width of the fourth sub-portion in the first direction are equal.

In another aspect, a display device is provided. The display device includes the display module as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1:
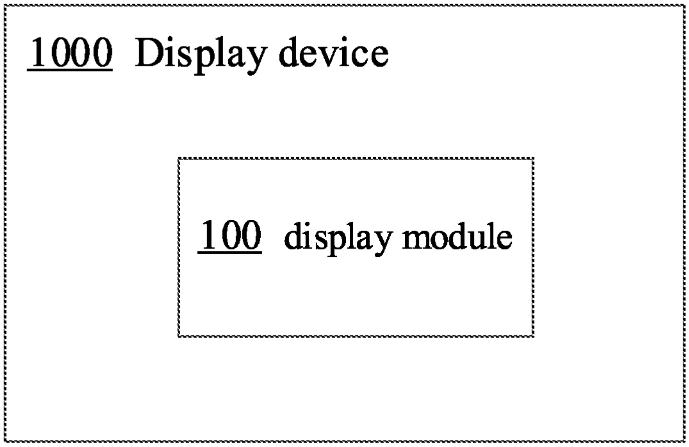
FIG. 1 is a block diagram showing a structure of a display device, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B, or C", and they both include the following combinations of A, B, and C: only A, only B, only C, a combination of A and B, a combination of A and C, a combination of B and C, and a combination of A, B, and C.

The phrase "A and/or B" includes following three combinations: only A, only B, and a combination of A and B.

The phrase "applicable to" or "configured to" as used herein indicates an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those state.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel" or "perpendicular" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; and the term "perpendicular" includes absolute perpendicularity and approximate perpendicularity, and an acceptable range of deviation of the approximate perpendicularity may also be a deviation within 5°.

It will be understood that, in a case where a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing.

FIG. 1 is a structural diagram of a display device in accordance with some embodiments. As shown in FIG. 1, the display device 1000 is a product having a function of displaying images (including images in stationary or images in motion (the images in motion may be a video)). For example, the display device 1000 may be any of a display, a television, a billboard, a digital photo frame, a laser printer having a display function, a telephone, a mobile phone, a personal digital assistant (PDA), a digital camera, a portable camcorder, a view finder, a navigator, a vehicle, a large-area wall, a household appliance, an information inquiry device (e.g., a business inquiry device for a department of e-government, bank, hospital, electricity or the like), and a monitor. The display device 1000 includes a display module 100 as described in any of the following embodiments.

Figure 2:
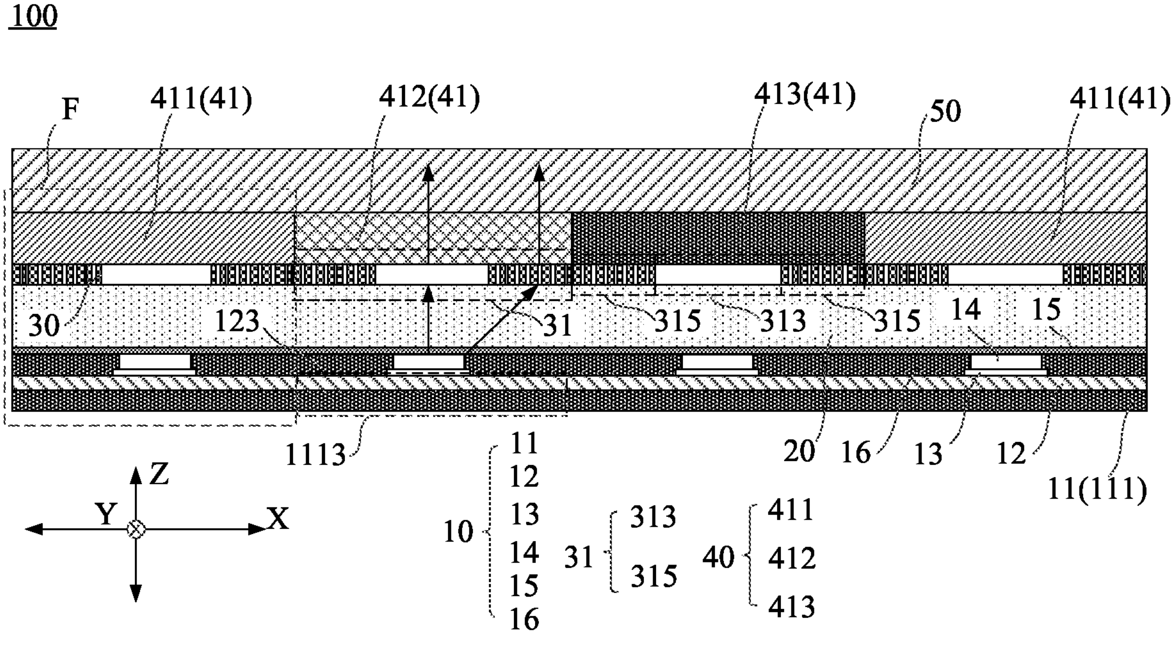
FIG. 2 is a structural diagram of a display module in the display device in FIG. 1.

FIG. 2 is a structural diagram of a display module 100 in the display device 1000 in FIG. 1. The display module 100 may be any of an organic light-emitting diode (OLED) display panel, a quantum dot light-emitting diode (QLED) display panel, and a tiny LED (including a mini LED or a micro LED, the LED being a light-emitting diode) display panel. Of course, the display module 100 may also be applied to any of other display devices, which is not limited in the present disclosure.

As shown in FIG. 2, the display module 100 includes a display substrate 10, an encapsulation layer 20, a color film layer 40 and a cover plate 50. The display substrate 10 includes a substrate 11 and a circuit structure layer 12, and the circuit structure layer 12 is located on the substrate 11.

For example, the substrate 11 may be a flexible substrate or a rigid substrate. For example, in a case where the substrate 11 is the flexible substrate, the material of the substrate 11 may be polydimethylsiloxane, polyimide (PI), polyethylene terephthalate (PET) and other materials with high elasticity. As another example, in a case where the substrate 11 is the rigid substrate, the material of the substrate 11 may be glass or the like.

The substrate 11 may have a display area 111 and a peripheral area adjacent to the display area 111, and the display area 111 includes a plurality of sub-pixel areas 1113. The circuit structure layer 12 includes a plurality of pixel driving circuits 123, and a pixel driving circuit 123 is provided corresponding to a sub-pixel area 1113.

The display substrate 10 further includes a plurality of light-emitting portions 14. The plurality of light-emitting portions 14 are located on a side of the circuit structure layer 12 away from the substrate 11, and a light-emitting portion 14 is provided corresponding to a pixel driving circuit 123. The display substrate 10 may further include first electrodes 13, a pixel defining layer 16, and a second electrode layer 15. The first electrode 13 is located between the light-emitting portion 14 and the circuit structure layer 12, and the second electrode layer 15 is located on a side of the light-emitting portion 14 away from the first electrode 13. The pixel defining layer 16 is located between adjacent light-emitting portions 14, and the pixel defining layer 16 is also located between the second electrode layer 15 and the circuit structure layer 12. Through the above provision, each pixel driving circuit 123 can drive a corresponding light-emitting portion 14 to emit light.

The encapsulation layer 20 may be located between the display substrate 10 and the color film layer 40. For example, the encapsulation layer 20 is located on a side of the second electrode layer 15 away from the substrate 11. The material of the encapsulation layer 20 may include, for example, an inorganic material or an organic material. For example, the material of the encapsulation layer 20 may include at least one of $SiN_x$, $SiO_2$, SiC, $Al_2O_3$ and ZnS; alternatively, the material of the encapsulation layer 20 may include resin or the like. The encapsulation layer 20 is used as a protection structure of the display substrate 10. In some embodiments, the thickness of the encapsulation layer 20 may be in a range of 0.8 μm to 0.9 μm, inclusive. For example, the thickness of the encapsulation layer 20 may be 0.8 μm, 0.85 μm or 0.9 μm.

The color film layer 40 is located on a light-exit side of the display substrate 10. For example, the color film layer 40 may be located between the encapsulation layer 20 and the cover plate 50. The light-exit side of the display substrate 10 is a side of the substrate 11 where the light-emitting portion 14 is disposed. In some embodiments. The thickness of the color film layer 40 may be in a range of 1 μm to 1.4 μm, inclusive. For example, the thickness of the color film layer 40 may be 1 μm, 1.2 μm or 1.4 μm.

The color film layer 40 includes a plurality of color film portions 41, and the plurality of color film portions 41 cover the plurality of light-emitting portions 14. For example, a color film portion 41 is provided corresponding to a light-emitting portion 14. Since a light-emitting portion 14 is provided corresponding to a pixel driving circuit 123, after the pixel driving circuit 123 drives the corresponding light-emitting portion 14 to emit light, the light emitted by the corresponding light-emitting portion 14 exits through the corresponding color film portion 41, so that the color film layer 40 may function as filtering.

The plurality of color film portions 41 include at least two color film portions 41 of different colors. For example, the plurality of color film portions 41 may include first color film portions 411, second color film portions 412 and third color film portions 413. For example, the first color film portion 411 may be a red color film portion 41, the second color film portion 412 may be a green color film portion 41, and the third color film portion 413 may be a blue color film portion 41. For example, the first color film portions 411, the second color film portions 412 and the third color film portions 413 may be arranged alternately, so that the color film portions 41 of different colors are adjacent. Through the above provision, exit light emitted by the plurality of light-emitting portions 14 may pass through the color film portions 41 to display a predetermined image.

With continued reference to FIG. 2, the display module 100 may further include the cover plate 50. The cover plate 50 is located on a side of the color film layer 40 away from the display substrate 10, so that the cover plate 50 may play a protective role. The material of the cover plate 50 is, for example, glass.

Figure 3:
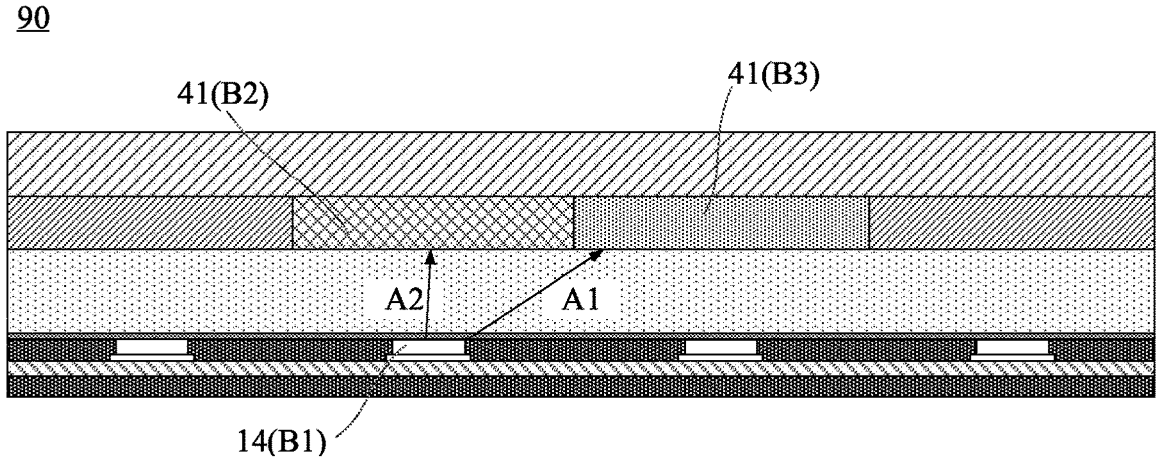
FIG. 3 is a structural diagram of a display module, in accordance with some embodiments in the related art.

FIG. 3 is a structural diagram of a display module 90 in accordance with some embodiments in the related art. As shown in FIG. 3, in exit light emitted by the light-emitting portion 14 (e.g., at a position B1 in the figure), a part (e.g., exit light at a position A2 in the figure) of the exit light is incident on a corresponding color film portion 41 (e.g., at a position B2 in the figure), and another part (e.g., exit light at a position A2 in the figure) thereof is incident on another color film portion 41 (e.g., at a position B3 in the figure) adjacent to the corresponding color film portion 41 (e.g., at the position B2 in the figure). The color film portions 41 of different colors are adjacent to each other, and thus crosstalk is generated between adjacent color film portions 41.

Figure 4:
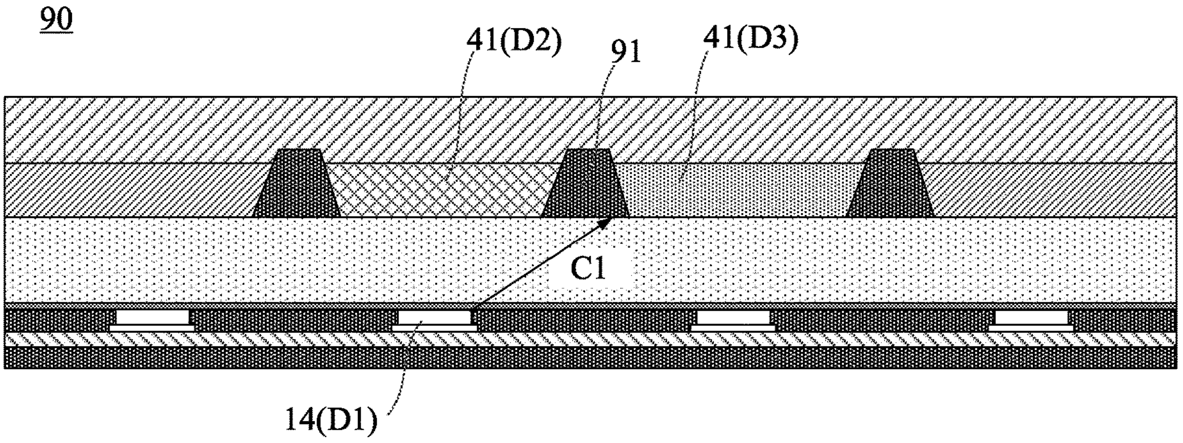
FIG. 4 is a structural diagram of another display module, in accordance with some embodiments in the related art.

FIG. 4 is a structural diagram of another display module 90 in accordance with some embodiments in the related art. As shown in FIG. 4, a black matrix 91 may be provided between adjacent color film portions 41, and the material of the black matrix 91 has a high absorption rate for light, so as to absorb a part (e.g., at a position C1 in the figure) of the light from the light-emitting portion 14 (e.g., at a position D1 in the figure). Thus, light incident on another color film portion 41 (e.g., at a position D3 in the figure) adjacent to the corresponding color film portion 41 (e.g., at a position D2 in the figure) may be reduced, thereby reducing the crosstalk between adjacent color film portions 41. In a display module 90 with high pixels per inch (PPI, the number of pixels per inch), a size of the color film portion 41 is reduced accordingly, and a size of the black matrix 91 should be reduced accordingly. However, limited by the precision of the fine metal mask (FMM), the size of the black matrix 91 is relatively large, resulting in a decrease in the amount of exit light from the color film portion 41.

Figure 5:
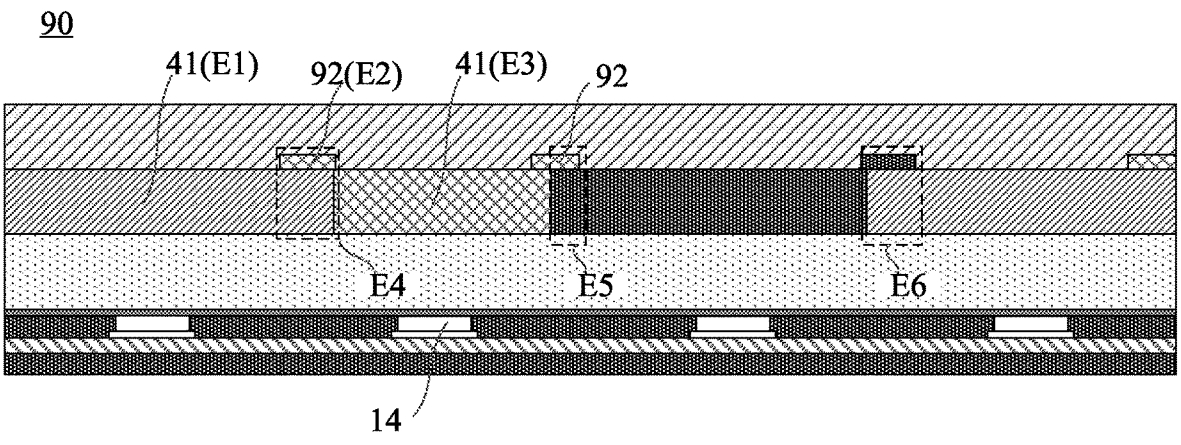
FIG. 5 is a structural diagram of yet another display module, in accordance with some embodiments in the related art.

FIG. 5 is a structural diagram of yet another display module 90, in accordance with some embodiments in the related art. As shown in FIG. 5, a corresponding overlapping layer 92 may be provided on a side of the color film portion 41 (e.g., at a position E1 in the figure) away from the display substrate 10, and the corresponding overlapping layer 92 (e.g., at a position E2 in the figure) and the color film portion 41 (e.g., at a position E3 in the figure) adjacent thereto may have the same color. Filtration of the overlapping layer 92 may reduce the influence of light with large angle between adjacent color film portions 41, thereby reducing the crosstalk between adjacent color film portions 41. Due to the different light filtering requirements of the color film portions 41 of different colors, the color film portions 41 of different colors and the corresponding overlapping layers 92 may have different widths of overlapping areas (e.g., E4, E5 and E6 in the figure have different widths). However, in order to ensure the effect of reducing the crosstalk between adjacent color film portions 41, the overlapping layer 92 has a relatively large width, which further limits the reduction in size of the color film portion 41.

Moreover, in order to ensure the amount of exit light from the color film portion 41, the display module 90 shown in FIG. 5 usually adopts a large cavity and long microcavity mode, so as to cause an increase in the thickness of the color film layer 40 and an increase in angle of the light from the light-emitting portion 14, thereby causing a part of the light from the corresponding light-emitting portion 14 to be incident on the adjacent color film portion 40, and further causing color shift in the display module 90.

In light of this, with continued reference to FIG. 2, in some embodiments of the present disclosure, a light modulation layer 30 is further included. The light modulation layer 30 is located between the color film layer 40 and the display substrate 10. For example, the light modulation layer 30 may be located between the encapsulation layer 20 and the color film layer 40.

The following will be described with reference to three directions of X, Y, and Z in FIG. 2. The first direction X and the second direction Y are parallel to the display substrate 10, and the first direction X intersects the second direction Y. The third direction Z intersects the display substrate 10. For example, the first direction X is perpendicular to the second direction Y, and the third direction Z is perpendicular to the display substrate 10. Hereinafter, the description will be taken only in an example where the first direction X is perpendicular to the second direction Y, and the third direction Z is perpendicular to the display substrate 10.

The light modulation layer 30 includes a plurality of modulation portions 31, and a modulation portion 31 is correspondingly disposed between a light-emitting portion 14 and a color film portion 41. The modulation portion 31 includes a modulation structure 315 and a transmission structure 313. For example, in the third direction Z, on a side of the modulation portion 31 away from the display substrate 10, the modulation portion 31 is disposed opposite to the light-emitting portion 14, and on a side of the modulation portion 31 proximate to the display substrate 10, the modulation portion 31 is disposed opposite to the color film portion 41. Through the above provision, the exit light from the light-emitting portion 14 may pass through the corresponding modulation portion 31, and then enter the corresponding color film portion 41.

The transmission structure 313 may be used to transmit part of the exit light of the corresponding light-emitting portion 14 into the corresponding color film portion 41. The modulation structure 315 may be adjacent to the transmission structure 313. By providing the transmission structure 313, it may be ensured that the exit light from the light-emitting portion 14 enters the corresponding color film portion 41 through the transmission structure 313, thereby ensuring the amount of exit light from the corresponding color film portion 41.

Figure 6:
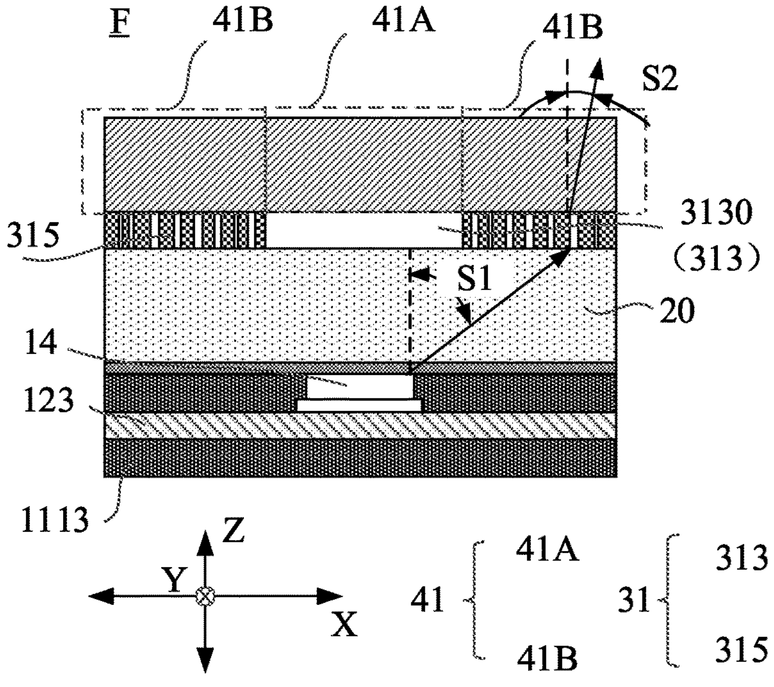
FIG. 6 is a partial enlarged view of an area F in FIG. 2.

FIG. 6 is a partial enlarged view of an area F in FIG. 2. As shown in FIG. 6, in some embodiments, an orthogonal projection of the transmission structure 313 on the display substrate 10 completely covers the corresponding light-emitting portion 14. For example, the area of the orthogonal projection of the transmission structure 313 on the display substrate 10 is larger than the area of the light-emitting portion 14, and the light-emitting portion 14 is located within the orthogonal projection of the transmission structure 313 on the display substrate 10. Through the above provision, it may further be ensured that the exit light from the light-emitting portion 14 is transmitted into the corresponding color film portion 41 through the corresponding transmission structure 313, thereby further increasing the amount of exit light from the corresponding color film portion 41 and further improving the brightness of the display module 100.

Of course, in some other embodiments, the light-emitting portion 14 may completely cover the orthogonal projection of the corresponding transmission structure 313 on the display substrate 10. Alternatively, in some other embodiments, the orthogonal projection of the transmission structure 313 on the display substrate 10 may coincide with the corresponding light-emitting portion 14. The embodiments of the present disclosure are not specifically limited thereto.

In some embodiments, as shown in FIG. 6, the transmission structure 313 may include a vacuum layer 3130. For example, in a process of forming the modulation portion 31, a vacuum layer may be formed in an area adjacent to the modulation structure 315 by vacuumizing. By providing the vacuum layer, the exit light from the corresponding light-emitting portion 14 will not be deflected after entering the transmission structure 313, which is beneficial to further increasing the amount of light passing through the corresponding transmission structure 313, thereby further increasing the amount of exit light of the corresponding color film portion 41, and further improving the brightness of the display module 100.

Of course, in some other embodiments, the material of the transmission structure 313 may alternatively include any of other materials with low refractive index. The refractive index of the transmission structure 313 may be in a range of 1.3 to 1.4. For example, the refractive index of the transmission structure 313 may be 1.3, 1.35 or 1.4, so as to ensure the amount of light, passing through the corresponding transmission structure 313, in the exit light emitted by the light-emitting portion 14, thereby ensuring the brightness of the display module 100.

Alternatively, the transmission structure 313 may be made of a corresponding material according to actual needs, which is not limited in some embodiments of the present disclosure.

As shown in FIG. 6, the color film portion 41 includes a first region 41A and a second region 41B. The orthogonal projection of the transmission structure 313 on the color film portion 41 is located within the first region 41A. The second region 41B is adjacent to another color film portion 41 of a different color. The orthogonal projection of the modulation structure 315 on the color film portion 41 is located in the second region 41B.

For example, since the orthogonal projection of the transmission structure 313 on the color film portion 41 is located within the first region 41A, in an embodiment where the orthogonal projection of the transmission structure 313 on the display substrate 10 completely covers the corresponding light-emitting portion 14, the orthogonal projection of the first region 41A on the display substrate 10 also completely covers the corresponding light-emitting portion 14. Through the above provision, it may be ensured that the exit light from the light-emitting portion 14 passes through the corresponding transmission structure 313 and is incident to the first region 41A of the corresponding color film portion 41, thereby increasing the amount of exit light from the corresponding color film portion 41, and further improving the brightness of the display module 100.

For example, the first region 41A and the second region 41B of the color film portion 41 are adjacent to each other. For example, the second region 41B may be disposed on a side of the first region 41A. Since the orthogonal projection of the modulation structure 315 on the color film portion 41 is located in the second region 41B, the modulation structure 315 may be disposed on a side of the transmission structure 313. Through the above provision, a part of the exit light from the light-emitting portion 14 passes through the modulation structure 315 and is incident onto the color film layer 40.

The modulation structure 315 is used to make the exit light from the corresponding light-emitting portion 14 converged. For example, when the exit light enters the modulation structure 315 at a first angle S1, the modulation structure 315 converges the exit light, so that the exit light enters the color film layer 40 at a second angle S2. The first angle S1 is larger than the second angle S2, the first angle S1 is an angle between the exit light from the light-emitting portion 14 and the third direction Z, and the second angle S2 is an angle between the converged exit light and the third direction Z. Through the above provision, it may be possible to reduce the exit light entering the adjacent color film portion 41, thereby reducing the crosstalk between the adjacent color film portions 41. In some embodiments, the modulation structure 315 may include, for example, a micro lens, so as to converge the exit light from the corresponding light-emitting portion 14.

To sum up, in the display module 100 provided by some embodiments of the present disclosure, the light modulation layer 30 is located between the color film layer 40 and the display substrate 10. The light modulation layer 30 includes a plurality of modulation portions 31, and a modulation portion 31 is provided correspondingly between a light-emitting portion 14 and a color film portion 41. The modulation portion 31 includes a modulation structure 315 and a transmission structure 313. The color film portion 41 includes a first region 41A and a second region 41B, and an orthogonal projection of the transmission structure 313 on the color film portion 41 is located within the first region 41A. Through the above provision, it may be ensured that the exit light from the light-emitting portion 14 is transmitted to the first region 41A of the corresponding color film portion 41 through the corresponding transmission structure 313, thereby increasing the amount of exit light of the corresponding color film portion 41, and further improving the brightness of the display mode 100. The second region 41B is adjacent to another color film portion 41 of a different color, and an orthogonal projection of the modulation structure 315 on the color film portion 41 is located within the second region 41B. Through the above provision, a part of the exit light from the light-emitting portion 14 enters the modulation structure 315. The modulation structure 315 converges the exit light, which is beneficial to increasing the exit light entering the second region 41B of the corresponding color film portion 41, and reducing exit light entering another color film portion 41 adjacent to the corresponding color film portion 41. Thus, the crosstalk between the adjacent color film portions 41 may be reduced, which is beneficial to improving the display contrast of the display module 100.

In addition, the above provision is beneficial to increasing the exit light entering the second region 41B of the corresponding color film portion 41, and reducing exit light entering another color film portion 41 adjacent to the corresponding color film portion 41, and is also helpful to improve color shift between adjacent color film portions 41.

Figure 7:
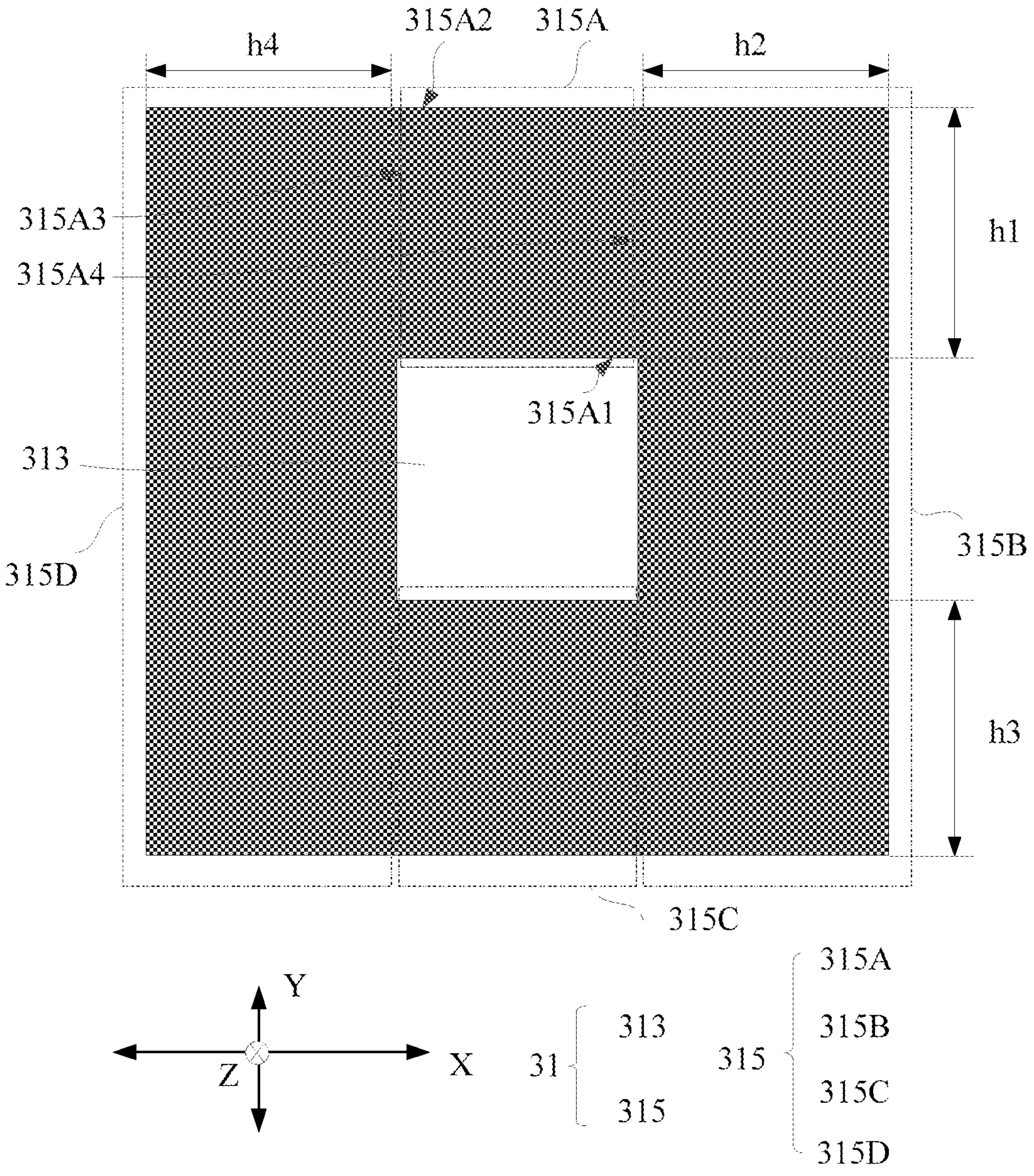
FIG. 7 is a top view of a modulation portion, in accordance with some embodiments.

FIG. 7 is a top view of a modulation portion 31 in accordance with some embodiments. In combination with FIGS. 7 and 6, the modulation structure 315 may be arranged around the transmission structure 313. For example, the modulation structure 315 may surround the transmission structure 313 along a circumferential direction of the transmission structure 313. For example, the cross-section of the transmission structure 313 may be in a shape of a rectangle, the cross-section of the modulation structure 315 may be in a shape of an annular, and the transmission structure 313 is located in the enclosed space of the modulation structure 315.

It can be understood that the light-emitting portion 14 is a Lambertian light-emitting portion, that is, the coverage angle of the exit light may include a range from −60° to +60° (i.e., with ±60°). Here, the "angle" refers to an angle between the exit light and the third direction Z. Referring to FIG. 6, among the exit light from the light-emitting portion 14, after passing through the encapsulation layer 20, the exit light with large angle is likely to enter a color film portion 41 adjacent to the corresponding color film portion 41, thereby causing the crosstalk between adjacent color film portions 41.

Through the above provision, for a color film portion 41, the modulation structure 315 is far away from the center of the color film portion 41 relative to the transmission structure 313, which is conducive to exit light with large angle entering the modulation structure 315, so that the modulation structure 315 converges the exit light with large angle, that is, the angle of the converged exit light is reduced. By converging the exit light with large angle, it may be beneficial to further increasing the exit light entering the second region 41B of the corresponding color film portion 41, and further reducing the exit light entering the another color film portion 41 adjacent to the corresponding color film portion 41, thereby reducing the crosstalk between adjacent color film portions 41, which is beneficial to improving the contrast of the display module 100.

Figure 8:
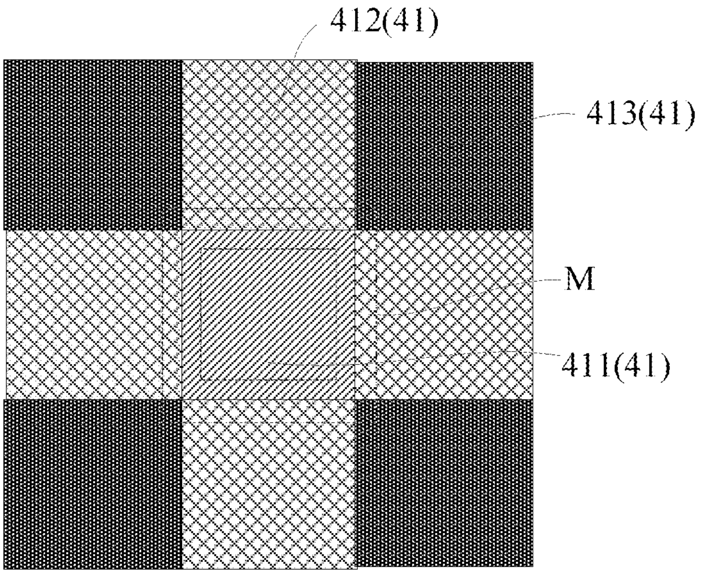
FIG. 8 is a structural diagram showing an arrangement of color film portions, in accordance with some embodiments.

In some embodiments, the color film layer 40 may include a plurality of color film portions 41 arranged in an array, and any two adjacent color film portions 41 have different colors. FIG. 8 is a structural diagram showing an arrangement of color film portions in accordance with some embodiments. As shown in FIG. 8, a color film portion 41 located in a middle of the figure may be a first color film portion 411, and color film portions 41 adjacent to the first color film portion 411 may include second color film portions 412 and third color film portions 413. The second color film portions 412 and the third color film portions 413 are alternately arranged along the circumferential direction of the first color film portion 411. Crosstalk is likely to occur between the first color film portion 411 and any color film portion 41 adjacent to the first color film portion 411, that is, crosstalk is likely to occur in the annular area M in the figure. The modulation structure 315 is disposed around the transmission structure 313, and the crosstalk between any two adjacent color film portions 41 may be reduced, thereby further improving the contrast of the display module 100.

In some other embodiments, the modulation structures 315 may be arranged at intervals along the circumferential direction of the transmission structure 313. For example, the cross-section of the transmission structure 313 may be in a shape of a rectangle, and the modulation structure 315 may be arranged along any two adjacent sides of the transmission structure 313, alternatively, the modulation structure 315 may be arranged along any three adjacent sides of the transmission structure 313. Alternatively, in some other embodiments, the modulation structure 315 may be disposed on a side of the transmission structure 313. Of course, the position arrangement of the modulation structure 315 and the transmission structure 313 may be set according to actual needs, which is not specifically limited in some embodiments of the present disclosure.

In some embodiments, with continued reference to FIG. 7, the modulation structure 315 may include a first sub-portion 315A, a second-portion 315B, a third-portion 315C, and a fourth-portion 315D that are connected end to end in sequence. The first sub-portion 315A and the third sub-portion 315C both extend in the first direction X and are arranged opposite to each other in the second direction Y. The second sub-portion 315B and the fourth sub-portion 315D both extend in the second direction Y and are arranged opposite to each other in the second direction Y. For example, the cross-section shapes of the first sub-portion 315A, the second sub-portion 315B, the third sub-portion 315C and the fourth sub-portion 315D are all rectangular. The first sub-portion 315A is located between the second sub-portion 315B and the fourth sub-portion 315D, and the first sub-portion 315A is adjacent to the second sub-portion 315B and the fourth sub-portion 315D. The third sub-portion 315C is located between the second sub-portion 315B and the fourth sub-portion 315D, and the third sub-portion 315C is adjacent to the second sub-portion 315B and the fourth sub-portion 315D. As a result, the first sub-portion 315A, the second sub-portion 315B, the third sub-portion 315C and the fourth sub-portion 315D are sequentially connected end to end.

A width of the first sub-portion 315A in the second direction Y, a width of the third sub-portion 315C in the second direction Y, a width of the second sub-portion 315B in the first direction X, and a width of the fourth sub-portion 315D in the first direction X may be equal. For example, the width of the first sub-portion 315A in the second direction Y may be a first distance h1, the width of the second sub-portion 315B in the first direction X may be a second distance h2, the width of the third sub-portion 315C in the second direction Y may be a third distance h3, and the width of the fourth sub-portion 315D in the first direction X may be a fourth distance h4. The first distance h1, the second distance h2, the third distance h3 and the fourth distance h4 may all be equal. The above provision is beneficial to improving the regularity of the modulation structure 315 and further improving the regularity of the modulation portion 31, and is also beneficial to reducing the manufacturing difficulty of the light modulation layer 30 and improving the manufacturing efficiency of the light modulation layer 30.

It will be noted that the term "equal" includes absolute equality and approximate equality. Due to certain uncontrollable errors (e.g., manufacturing process errors, equipment accuracy, measurement errors), among the width of the first sub-portion 315A in the second direction Y, the width of the third sub-portion 315C in the second direction Y, the width of the second sub-portion 315B in the first direction X and the width of the fourth sub-portion 315D in the first direction X, if a difference between any two is within an acceptable range of deviation, it may be considered that the distances are approximately equal. The acceptable range of deviation may be any of 30%, 20%, 10% or 5%.

Of course, in some other embodiments, the width of the first sub-portion 315A in the second direction Y, the width of the third sub-portion 315C in the second direction Y, the width of the second sub-portion 315B in the first direction X and the width of the fourth sub-portion 315D in the first direction X may be set according to actual needs. For example, the width of the first sub-portion 315A in the second direction Y, the width of the third sub-portion 315C in the second direction Y, the width of the second sub-portion 315B in the first direction X and the width of the fourth sub-portion 315D in the first direction X may be different from one another, which is not limited in some embodiments of the present disclosure.

In some embodiments, an orthogonal projection of the modulation portion 31 on the display substrate coincides with an orthogonal projection of the corresponding color film portion 41 on the display substrate. For example, the cross-sectional shape of the modulation portion 31 is the same as the cross-sectional shape of the color film portion 41, and an edge of the modulation portion 31 is aligned with an edge of the corresponding color film portion 41, that is, an edge of the modulation structure 315 in the modulation portion 31 is aligned with the edge of the corresponding color film portion 41. Through the above provision, in any two adjacent color film portions 41, the corresponding two modulation structures 315 are adjacent to each other, so that the exit light with large angle may be further converged, which is beneficial to further increasing exit light entering the second region 41B of the corresponding color film portion 41, and further reducing exit light entering the another color film portion 41 adjacent to the corresponding color film portion 41. Thus, the crosstalk between adjacent color film portions 41 may be reduced, which is beneficial to improving the display contrast of the display module 100.

It will be noted that the term "coincide" includes absolute coincidence and approximate coincidence. That is, a floating range of a gap between the orthogonal projection of the modulation portion 31 on the display substrate and the orthogonal projection of the corresponding color film portion 41 on the display substrate does not exceed the error threshold, and it may also be considered that the edges of the two orthogonal projections "coincide" relatively. The present disclosure does not limit the specific value of the error threshold, and it is guaranteed that the gap is within the range of the error threshold.

Of course, in some other embodiments, the plurality of color film portions 41 may be arranged in other types, and the position of the modulation structure 315 in the modulation portion 31 may be set accordingly. For example, the first color film portion 411, the second color film portion 412, and the third color film portion 413 may be arranged alternately side by side in the first direction X. Correspondingly, the modulation structure 315 in the modulation portion 31 may be located on both sides of the transmission structure 313 in the direction X.

Figure 9:
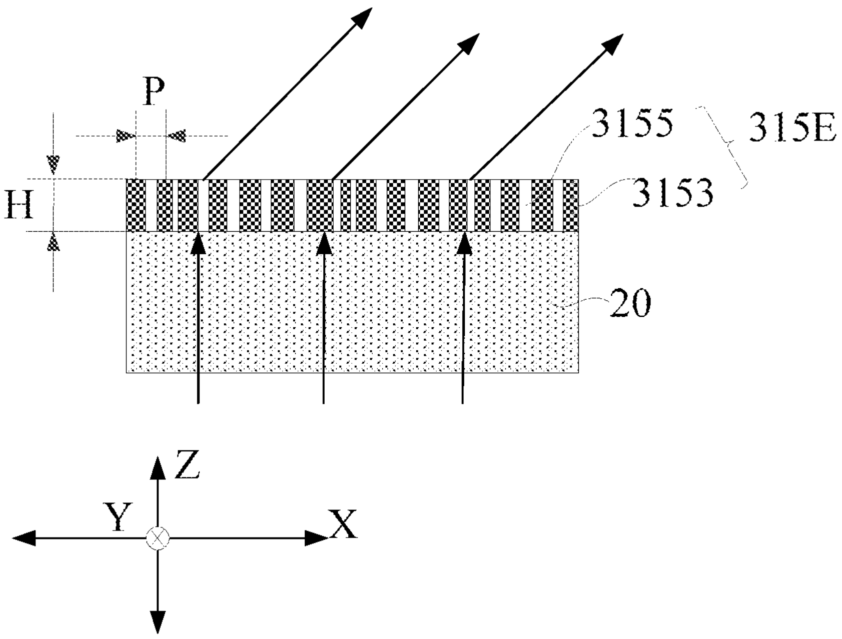
FIG. 9 is a structural diagram of a metasurface structure, in accordance with some embodiments.

FIG. 9 is a structural diagram of a metasurface structure 315E in accordance with some embodiments. As shown in FIG. 9, in some embodiments, the modulation structure 315 may include a metasurface structure. The metasurface structure 315E includes a plurality of unit structures 3153, and the plurality of unit structures 3153 are arranged in an array. Center lines of any two adjacent unit structures 3153 have an equal distance therebetween, and each unit structure 3153 has an equal height in a direction perpendicular to the display substrate 10. The third direction Z is perpendicular to the display substrate 10.

For example, the plurality of unit structures 3153 may be arranged at intervals in a direction parallel to the display substrate 10, and extension directions of the plurality of unit structures 3153 are all perpendicular to the display substrate 10. The unit structure 3153 may be in an order of a small wavelength, and electromagnetic wave modulation of the metasurface structure 315E may be realized through the arrangement design of the unit structures.

Figure 10:
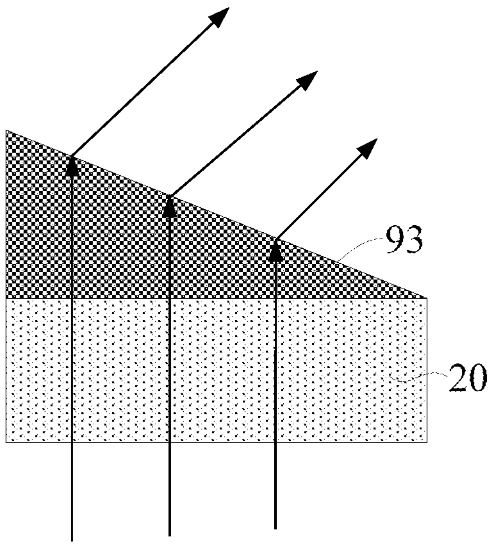
FIG. 10 is a structural diagram of an optical wedge, in accordance with some embodiments.

FIG. 10 is a structural diagram of an optical wedge 93 in accordance with some embodiments. As shown in FIG. 10, the optical wedge 93 is a prism with a very small apex angle (generally less than 1/10 radian), and the optical wedge 93 may also be called a wedge mirror. When the light enters the optical wedge 93 vertically or nearly vertically, the optical wedge 93 may deflect the light. With continued reference to FIG. 9, a principle of light modulation of the metasurface structure 315E is similar to that of the optical wedge 93. For example, the metasurface structure 315E may also make the light incident vertically or nearly vertically deflected and exit. That is, when the exit light from the light-emitting portion 14 is incident on the metasurface structure 315E at a relatively large angle, the metasurface structure 315E deflects the exit light (i.e., make the exit light converged), and the converged exit light may exit at a relatively small angle.

For example, for the visible light band, the distance between the center lines of any two adjacent unit structures 3153 may be a periodic distance P. The periodic distance P may be equal to half of a wavelength of the exit light from the light-emitting portion 14, so that the size of the unit structure 3153 may have a half-wavelength order, and the unit structure 3153 may have a discretized phase modulation effect. Through the arrangement of the plurality of unit structures 3153, the light modulation effect of the metasurface structure 315E in an order of hundreds of nanometers may further be realized.

Here, the term "equal" includes absolute equality and approximate equality. That is, a floating range of a difference between the distance between the center lines of any two adjacent unit structures 3153 and half of the wavelength of the exit light from the light-emitting portion 41 does not exceed the error threshold. The present disclosure does not limit the specific value of the error threshold, and it is guaranteed that the difference is within the range of the error threshold.

As described in the above embodiments, in a display module 100 with high PPI, the size of the color film portion 41 is reduced accordingly. For example, the size of the color film portion 41 may be reduced to an order of microns, and correspondingly, the size of the corresponding modulation structure 315 may be reduced to an order of hundreds of nanometers. The above setting is beneficial to reducing the crosstalk between adjacent pixels in the display module 100 with high PPI.

Figure 11:
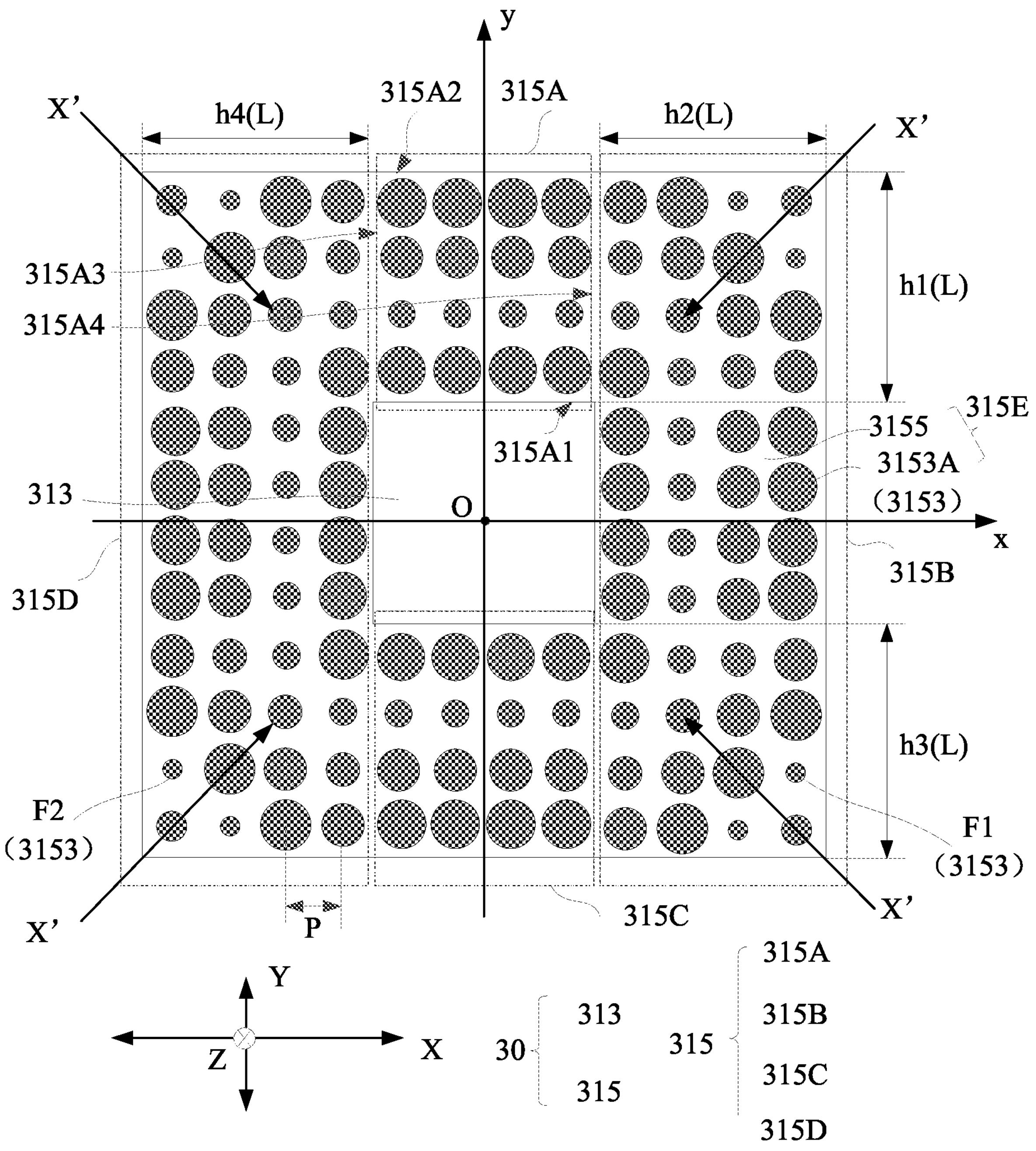
FIG. 11 is a top view of another modulation portion, in accordance with some embodiments.

FIG. 11 is a structural diagram of another metasurface structure 315E in accordance with some embodiments. Referring to FIG. 11, the plurality of unit structures 3153 may be centrally symmetrical. As described in the above embodiments, the modulation structure 315 may be arranged around the transmission structure 313, and the modulation structure 315 includes a plurality of unit structures 3153, so that the plurality of unit structures 3153 may be arranged around the transmission structure 313. As shown in FIG. 11, the plurality of unit structures 3153 are centrally symmetrical about a center point O of the modulation structure 315. Since the sizes of the unit structures 3153 are related to a phase value generated by the unit structure 3153, by arranging the unit structures 3153, the metasurface structure 315E may have a corresponding phase expression value, that is, the metasurface structure 315E has a desired light modulation effect. The above provision is beneficial to equivalently improve the crosstalk effect between any two adjacent color film portions 41, and further beneficial to achieving a uniform display effect of the display module 100.

Here, the term "centrally symmetrical" means that the plurality of unit structures 3153 may include absolute centrally symmetry and approximate centrally symmetry. The approximate central symmetry may be understood as that an overall structure of the plurality of unit structures 3153 presents a trend of being symmetrical, and there are changes in part of the plurality of unit structures 3153. For example, as shown in FIG. 11, in a direction from an edge of the modulation structure 315 to a center of the modulation structure 315 (i.e., an X' direction in the figure), the sizes of the plurality of unit structures 3153 increase from a small value to a maximum value, and then decrease from the maximum value to a minimum value, so that the overall structure of the plurality of unit structures 3153 presents the trend of being symmetrical. There may be a difference between sizes of two unit structures 3153 that are symmetrical (e.g., the unit structures 3153 at positions F1 and F2 in the figure), and a floating range of the difference does not exceed the error threshold. The present disclosure does not limit the specific value of the error threshold, and it is guaranteed that the difference is within the range of the error threshold.

In some embodiments, a material of the unit structure 3153 may include silicon nitride. Here, the term "silicon nitride" means and includes a compound including silicon atom(s) and nitrogen atom(s). Silicon nitride may include silicon and nitrogen with a stoichiometric number (e.g., $Si_3N_4$), or may include silicon and nitrogen with a non-stoichiometric number (e.g., $SiN_x$).

Through the above provision, the exit light from the light-emitting portion 14 may be deflected by the unit structures 3153, so that the unit structures 3153 may converge the exit light from the light-emitting portion 14, that is, the modulation structure 315 may converge the exit light, which is beneficial to increasing the exit light entering the corresponding color film portion 41, and reducing exit light entering the another color film portion 41 adjacent to the corresponding color film portion 41. Thus, the crosstalk between adjacent color film portions 41 may be reduced, which is beneficial to improving the display contrast of the display mode 100.

With continued reference to FIG. 11 and in conjunction with FIG. 9, the metasurface structure 315E further includes an isolation structure 3155, and the isolation structure 3155 is located between the plurality of unit structures 3153. The refractive index of the unit structure 3153 is greater than that of the isolation structure 3155. For example, the isolation structure 3155 may include a solid isolation material (e.g., the isolation structure 3155 may include an adhesive material). By providing the isolation structure 3155, the plurality of unit structures 3153 may be isolated. Of course, in some other embodiments, the material of the isolation structure 3155 may be a material capable of realizing isolation between the unit structures 3153.

In some embodiments, a difference between the refractive index of the unit structure 3153 and the refractive index of the isolation structure 3155 is in a range of 1.03 to 1.3, inclusive. For example, the difference between the refractive index of the unit structure 3153 and the refractive index of the isolation structure 3155 may be 1.03, 1.2 or 1.3. In the embodiment where the isolation structure 3155 is an adhesive material, the refractive index of the isolation structure 3155 may be in a range of 1.3 to 1.4, for example, the refractive index of the isolation structure 3155 may be 1.3, 1.35 or 1.4. Since the refractive index of the unit structure 3153 may be greater than the refractive index of the isolation structure 3155, and the difference between the refractive index of the unit structure 3153 and the refractive index of the isolation structure 3155 is in the range of 1.03 to 1.3, the refractive index of the unit structure 3153 may be in a range of 2.33 to 2.7. For example, the refractive index of the unit structure 3153 may be 2.33, 2.4, 2.5, 2.6 or 2.7. The difference between the refractive index of the unit structure 3153 and the refractive index of the isolation structure 3155 may approach 1.03, which is beneficial to ensuring the phase expression of the unit structure 3153, and further realizing the modulation effect of the modulation structure 315. The difference between the refractive index of the unit structure 3153 and the refractive index of the isolation structure 3155 may approach 1.3, which is beneficial to improving the phase retardation effect of the unit structure 3153, and further increasing the angle of the exit light deflected by the unit structure 3153.

Of course, the difference between the refractive index of the unit structure 3153 and the refractive index of the isolation structure 3155 may be greater than 1.3, so as to further improve the phase delay effect of the unit structure 3153 and further increase the angle of the exit light deflected by the unit structure 3153.

In summary, the above provision is beneficial for the unit structures 3153 having a corresponding phase expression value, that is, to making the metasurface structure 315E have the required light modulation effect. As a result, the modulation structure 315 may converge the exit light, which is beneficial to increasing the exit light entering the corresponding color film portion 41, and reducing exit light entering the another color film portion 41 adjacent to the corresponding color film portion 41. Thus, the crosstalk between adjacent color film portions 41 may be reduced, which is beneficial to improving the display contrast of the display mode 100.

In some examples, the material of the isolation structure 3155 may be the same as that of the transmission structure 313. For example, the material of the isolation structure 3155 and the material of the transmission structure 313 may be adhesive materials; alternatively, the isolation structure 3155 and the transmission structure 313 may both include vacuum layers. The material of the isolation structure 3155 is the same as that of the transmission structure 313, so that the isolation structure 3155 and the transmission structure 313 are formed synchronously, which is beneficial to reducing the manufacturing difficulty of the light modulation layer 30 and further improving the manufacturing efficiency of the display module 100.

With continued reference to FIG. 11, the modulation structure 315 may include a first edge 315A1 and a second edge 315A2 oppositely disposed, the first edge 315A1 is provided proximate to the transmission structure 313, and the second edge 315A2 is provided away from the transmission structure 313. As described in the above embodiments, the modulation structure 315 may include the first sub-portion 315A, the second sub-portion 315B, the third sub-portion 315C, and the fourth sub-portion 315D that are connected end to end in sequence. In some embodiments, the first edge 315A1 and the second edge 315A2 may be located in any of the first sub-portion 315A, the second sub-portion 315B, the third sub-portion 315C and the fourth sub-portion 315D.

By taking the first sub-portion 315A as an example, the positions of the first edge 315A1 and the second edge 315A2 in the first sub-portion 315A will be described below. For example, the cross-sectional shape of the first sub-portion 315A may be a rectangle. The first sub-portion 315A may include the first edge 315A1, the second edge 315A2, a third edge 315A3 and a fourth edge 315A4. The first edge 315A1 and the second edge 315A2 are oppositely arranged, and the third edge 315A3 and the fourth edge 315A4 are oppositely arranged. An edge of the first sub-portion 315A proximate to the transmission structure 313 may be the first edge 315A1, an edge of the first sub-portion 315A away from the transmission structure 313 may be the second edge 315A2. An edge of the first sub-portion 315A adjacent to the fourth sub-portion 315D is the third edge 315A3, and the third edge 315A3 is also adjacent to the first edge 315A1 and the second edge 315A2. An edge of the first sub-portion 315A adjacent to the second sub-portion 315B is the fourth edge 315A4, and the fourth edge 315A4 is adjacent to the first edge 315A1 and the second edge 315A2. A distance L between the first edge 315A1 and the second edge 315A2 is a width of the first sub-portion 315A in the second direction Y, that is, the first distance h1.

As described in the above embodiments, the first distance h1, the second distance h2, the third distance h3 and the fourth distance h4 may all be equal. The distance L between the first edge 315A1 and the second edge 315A2 may be any of the first distance h1, the second distance h2, the third distance h3 and the fourth distance h4.

In some embodiments, the distance L between the first edge 315A1 and the second edge 315A2 may satisfy the following formula (1):

$$L = T2 \times \tan\theta. \tag{1}$$

In formula (1), L is the distance between the first edge 315A1 and the second edge 315A2.

Figure 12:
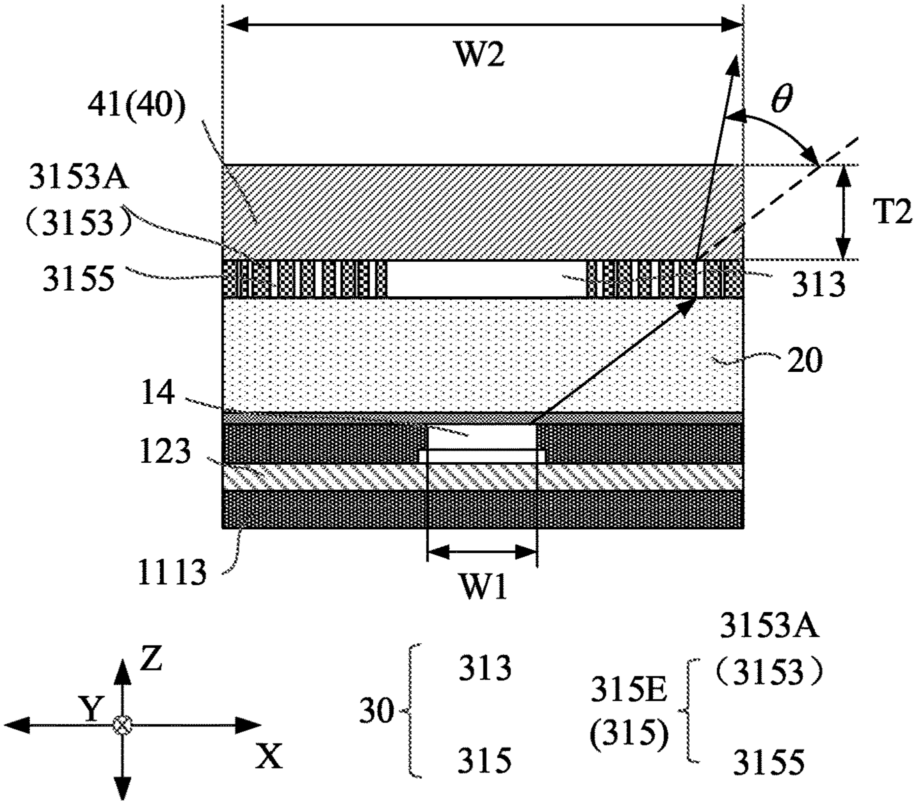
FIG. 12 is a transmission diagram of a light path between a color film portion and a corresponding light-emitting portion, in accordance with some embodiments.

FIG. 12 is a transmission diagram of a light path between a color film portion 41 and a corresponding light-emitting portion 14 in accordance with some embodiments. As shown in FIG. 12, in formula (1), T2 is a thickness of a color film portion 41 corresponding to the modulation structure 315, and θ is an angle at which the modulation structure 315 deflects the light from the light-emitting portion 14. $\theta=\sin^{-1}(1/n)$, where n is a refractive index of the color film portion 41 corresponding to the modulation structure 315.

Referring to FIG. 12, the angle at which the modulation structure 315 deflects the light from the light-emitting portion 14 refers to an included angle between exit light from the light-emitting portion 14 and exit light converged by the modulation structure 315.

Referring to FIG. 12, it can be understood that crosstalk between adjacent color film portions 41 is mainly affected by a width W1 of the light-emitting portion 14 and a width W2 of the color film portion 41. For example, in a case where the width W2 of the color film portion 41 decreases and the width W1 of the light-emitting portion 14 increases, exit light entering the adjacent color film portion 41 increases, resulting in an increase in crosstalk between the adjacent color film portions 41.

Through the above provision, the angle at which the modulation structure 315 deflects the light from the light-emitting portion 14 is a total reflection angle of the color film portion 41. The distance between the first edge 315A1 and the second edge 315A2 is determined according to parameters of the color film portion 41, which is beneficial to further increasing the exit light entering the corresponding color film portion 41, and reducing exit light entering the another color film portion 41 adjacent to the corresponding color film portion 41. Thus, the crosstalk between adjacent color film portions 41 may be reduced, which is conducive to improving the display contrast of the display mode 100.

As described in the above embodiments, the color film portions 41 include the first color film portions 411, the second color film portions 412 and the third color film portions 413 of different colors. In some embodiments, the refractive indices corresponding to the first color film portion 411, the second color film portion 412 and the third color film portion 413 are all different, that is, angles at which modulation structures 315 corresponding to the first color film portion 411, the second color film portion 412 and the third color film portion 413 deflect the light from light-emitting portions 14 are all different. Distances L between first edges 315A1 and second edges 315A2 in modulation structures 315 corresponding to color film portions 41 of different colors are all different as well.

With continued reference to FIG. 11, any unit structure 3153 may have a different phase value. The unit structure 3153 may include a first column 3153A extending in the third direction Z, and a first column 3153A corresponding to any unit structure 3153 has a different size. By providing the plurality of unit structures 3153 with different phase values, the modulation structure 315 has the required light modulation capability. As described in the above embodiments, heights of the unit structures 3153 in the direction perpendicular to the display substrate 10, that is, distances of the plurality of first columns 3153A in the third direction Z are all equal.

For example, in a case where a distance between center lines of any two adjacent unit structures 3153 may be 250 nm, a distance of a first column 3153A in the third direction Z may be 850 nm, and a diameter of the first column 3153A may be in a range of 94 nm to 218 nm.

In some embodiments, the phase value of the unit structure 3153 may be in a range of 0 to 2π(m−1)/m, where m is a positive integer. For example, 8 unit structures 3153 with different phase values may be selected, that is, m may be 8. The phase values of the 8 unit structures may be uniformly distributed within the value range. The phase values of the unit structures 3153 may include 0, π/4, π/2, 3π/4, π, 5π/4, 3π/2 and 7π/4. By selecting the range of the phase value of the unit structure 3153, the modulation structure 315 may express the phase value within the corresponding range, that is, the value range of the phase value expressed by the modulation structure 315 is 0 to 2π, so as to realize two-dimensional modulation feature of the modulation structure 315. As a result, the modulation structure 315 may perform phase delay on the corresponding light, that is, the modulation structure 315 has the light modulation capability. The more the number of the phase values of the selected unit structures 3153, that is, the larger the m, the more accurate the phase value expressed by the modulation structure 315.

In addition, the phase values of the plurality of unit structures may be evenly distributed within the value range, so that the phase value may be expressed by the modulation structure 315.

In some embodiments, the plurality of light-emitting portions 14 are each configured to emit white light. The plurality of unit structures 3153 each perform phase modulation on white light, so that the modulation structure 315 has a modulation effect on white light. The periodic distance P may be equal to half of the wavelength of white light.

Here, the term "equal" may include absolute equality and approximate equality. That is, due to certain uncontrollable errors (e.g., manufacturing process errors, equipment accuracy, measurement errors), a difference between the periodic distance P and half of the wavelength of white light within an acceptable range of deviation may be considered approximately equal. The acceptable range of deviation may be any of 30%, 20%, 10% or 5%.

The design process of the size and position of the unit structure 3153 in the embodiments in which the plurality of light-emitting portions 14 are each configured to emit white light will be briefly described in the following.

Figure 13:
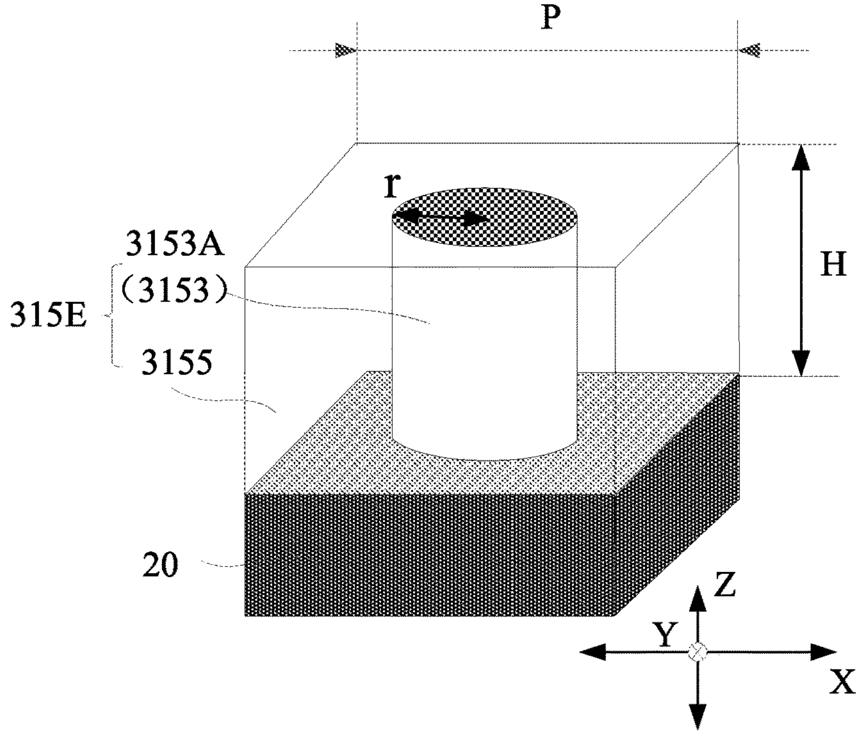
FIG. 13 is a structural diagram of a unit structure in a metasurface structure, in accordance with some embodiments.

FIG. 13 is a structural diagram of a unit structure 3153 in a metasurface structure 315E in accordance with some embodiments. As shown in FIG. 13, the first column 3153A may be a cylinder. As described in the above embodiments, any unit structure 3153 has a different phase value, and a first column 3153A corresponding to any unit structure 3153 has a different size, that is, the first column 3153A corresponding to any unit structure 3153 has a different radius.

Of course, in some other embodiments, the first column 3153A may be a prism, or a column with one of other cross-sectional shapes. The embodiments of the present disclosure do not specially limit thereto.

In some examples, after selecting the value range of the unit structures 3153, each first column 3153A has a corresponding phase value. According to the corresponding phase value of the first column 3153A, the corresponding radius of the first column 3153A may be calculated. The radius r of the first column 3153A corresponding to any unit structure 3153 satisfies the following formula (2):

$$n_{eff} = \sqrt{n_1^2 - \left(\frac{U(r, n_2)\lambda}{2\pi r}\right)^2}. \tag{2}$$

In formula (2), $n_{eff}$ is an equivalent refractive index corresponding to the unit structure 3153. The equivalent refractive index $n_{eff}$ may satisfy the following formula (3):

$$\varphi = \frac{2\pi}{\lambda} n_{eff} H. \tag{3}$$

In formula (3), φ is a phase value corresponding to the unit structure 3153, H is a height of the unit structure 3153 in the third direction Z, and λ is a wavelength of light from the light-emitting portion 14 corresponding to the unit structure 3153.

Since the light-emitting portion 14 is configured to emit white light, the wavelength of the light from the light-emitting portion 14 corresponding to the unit structure 3153 may be the wavelength of the white light, so that the modulation portion 31 may perform modulation on white light.

The height H of the unit structure 3153 in the third direction Z may be determined according to a maximum phase value of the unit structure 3153. For example, the phase value of the unit structure 3153 is 2π, that is, φ=2π, and in this case, $H=\lambda/n_{eff}$. The maximum refractive index $n_{eff}$ of the unit structure 3153 may be selected as $n_{eff}$, so as to obtain a first height $H_1$ of the unit structure 3153 in the third direction Z, that is, $H_1=\lambda/n_{max}$. The above settings may facilitate implementation of the phase delay of the modulation structure 315 on the corresponding light, that is, the modulation structure 315 has the light modulation capability.

Of course, in some other embodiments, the height H of the unit structure 3153 in the third direction Z may be determined according to other phase values and equivalent refractive index values. For example, the height H of the unit structure 3153 in the third direction Z may be greater than the first height $H_1$.

In formula (2), $U(r,n_2)$ is a Bessel function related to r and $n_2$, r is a radius of the first column 3153A corresponding to the unit structure 3153, and $n_2$ is a refractive index of the unit structure 3153.

In formula (2), $n_1$ is a refractive index of the isolation structure 3155.

In summary, the radius of the first column 3153A corresponding to the unit structure 3153 and the equivalent refractive index of the first column 3153A corresponding to the unit structure 3153 may be obtained by calculation according to the phase value of the unit structure 3153 through formula (2) and formula (3).

It can be understood that, since the radii of the plurality of first columns 3153A are all different, the duty ratios of the plurality of unit structures 3153 are all different. Here, the duty ratio refers to a ratio of a diameter of the first column 3153A to the periodic distance P. The periodic distance P is the distance between the center lines of two adjacent unit structures 3153, that is, the distance between two adjacent first columns 3153A. A maximum value $D_{max}$ of the diameter of the first column 3153A is equal to the periodic distance P, that is, in a case where the diameter of the first column 3153A is the maximum value $D_{max}$, $D_{max}/P=1$. Therefore, the duty ratio of the first column 3153A is 1.

Figure 14:
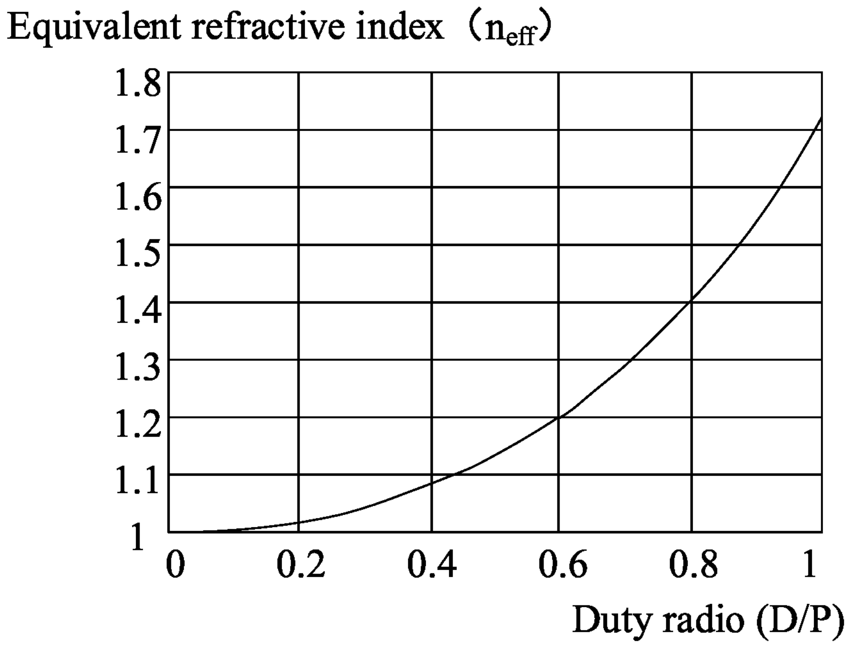
FIG. 14 is a relationship curve of an equivalent refractive index of a first column to a duty ratio of the first column, in accordance with some embodiments.

FIG. 14 is a relationship curve of an equivalent refractive index of a first column 3153A to a duty ratio of the first column 3153A in accordance with some embodiments. As shown in FIG. 14, since the diameter D) of the first column 3153A is equal to the radius r of the first column 3153A multiplied by 2, the relationship curve of the equivalent refractive index $n_{eff}$ of the first column 3153A to the duty ratio of the first column 3153A may be obtained through formula (2) and formula (3).

In some other examples, the equivalent refractive index $n_{eff}$ of the first column 3153A may be calculated through formula (3) according to the phase value of the unit structure 3153. The corresponding duty ratio of the first column 3153A is obtained by look-up in the relationship curve of the equivalent refractive index $n_{eff}$ of the first column 3153A to the duty ratio of the first column 3153A according to the equivalent refractive index $n_{eff}$ of the first column 3153A, and then the radius of the first column 3153A is obtained.

In some embodiments, as shown in FIG. 11, corresponding coordinate values of the unit structure 3153 may be determined according to the phase value of the unit structure 3153, that is, the position of the unit structure 3153 in the modulation structure 315 may be determined. The coordinates of the first column 3153A corresponding to any unit structure 3153 may satisfy the following formula (4):

$$\varphi(x, y) = \frac{2\pi n_2}{\lambda}(x + y)\sin\theta. \tag{4}$$

In formula (4), $n_2$ is the refractive index of the unit structure 3153, and $\lambda$ is a wavelength of light from the light-emitting portion 14 corresponding to the unit structure 3153. Since the light-emitting portion 14 is configured to be capable of emit white light, the wavelength of the light from the light-emitting portion 14 corresponding to the unit structure 3153 may be the wavelength of the white light.

In formula (4), referring to FIG. 12, 0 is the angle at which the unit structure 3153 deflects the light from the corresponding light-emitting portion 14. Since the light-emitting portion 14 is configured to emit white light, the wavelength of the light from the light-emitting portion 14 corresponding to the unit structure 3153 may be the wavelength of the white light.

In formula (4), referring to FIG. 11, θ is a coordinate value of the unit structure 3153 on a first coordinate axis, and the first coordinate axis extends in the first direction X; y is a coordinate value of the unit structure 3153 on the second coordinate axis, and the second coordinate axis extends in the second direction Y. A common origin of the first coordinate axis and the second coordinate axis is located at a midpoint of the modulation portion 31. For example, the midpoint of the modulation portion 31 is the midpoint O in the figure.

To sum up, during design and arrangement of the plurality of unit structures 3153 in the modulation portion 31, for any unit structure 3153, a phase value may be selected within the value range of the phase value of the unit structure 3153. The corresponding equivalent refractive index and radius of the unit structure 3153 may be obtained through formula (2) and formula (3) according to the corresponding phase value, so as to obtain the size of the unit structure 3153. Further, the corresponding coordinates of the unit structure 3153 is obtained through formula (4) according to the corresponding phase value. By analogy, sizes and positions of the plurality of unit structures 3153 may be designed, so as to form the corresponding modulation structure 315 and achieve the corresponding light modulation effect, thereby reducing the exit light entering the another color film portion 41 adjacent to the corresponding color film portion 41. As a result, the crosstalk between adjacent color film portions 41 may be reduced, which is beneficial to improving the display contrast of the display module 100.

Figure 15:
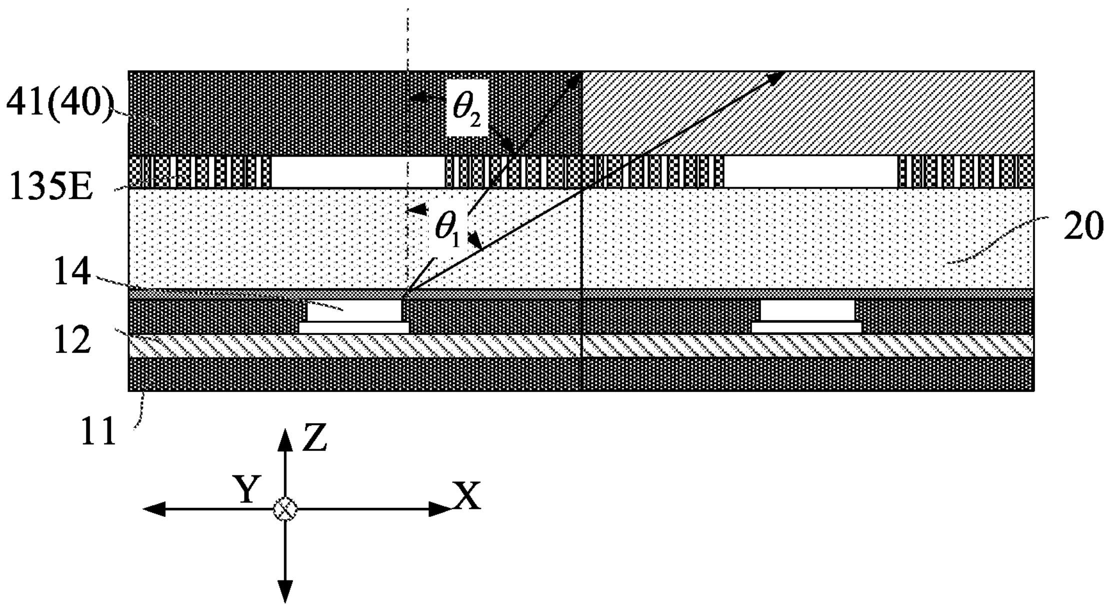
FIG. 15 is a structural diagram of two adjacent color film portions in a display module, in accordance with some embodiments.

FIG. 15 is a structural diagram of two adjacent color film portions 41 in the display module 100 in accordance with some embodiments. As shown in FIG. 15, in the exit light from the light-emitting portion 14, a maximum angle between exit light entering the adjacent color film portion 41 and the third direction Z is $\theta_1$, and a minimum angle between exit light entering the adjacent color film portion 41 and the third direction Z is $\theta_2$. For example, the maximum angle $\theta_1$ between the exit light entering the adjacent color film portion 41 and the third direction Z may be 21°, and the minimum angle $\theta_2$ between the exit light entering the adjacent color film portion 41 and the third direction Z may be 41°. That is, the exit light, emitted by the light-emitting portion 14, with an angle in a range of 21° to 41° may all enter the adjacent color film portion 41, resulting in crosstalk between adjacent color film portions 41.

Figure 16:
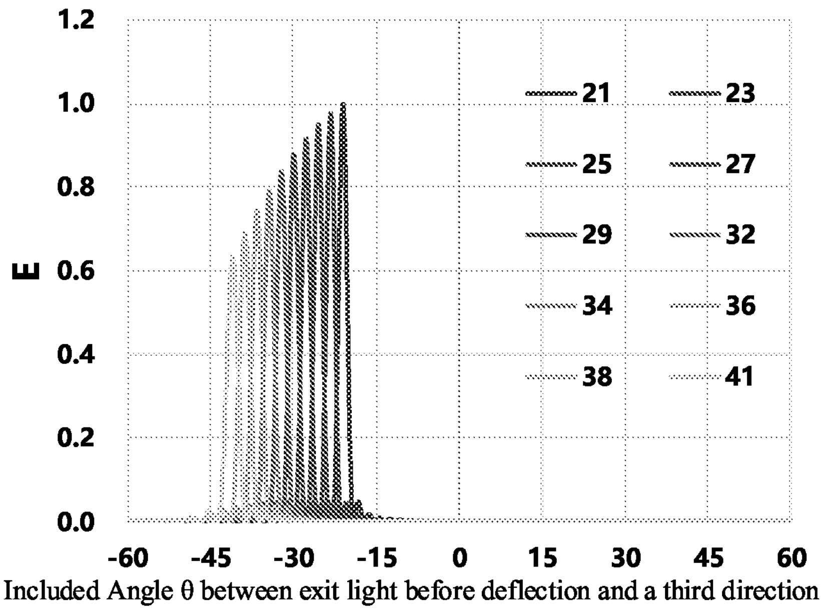
FIG. 16 is a brightness distribution diagram before deflection of the exit light entering the adjacent color film portion, in accordance with some embodiments.
Figure 17:
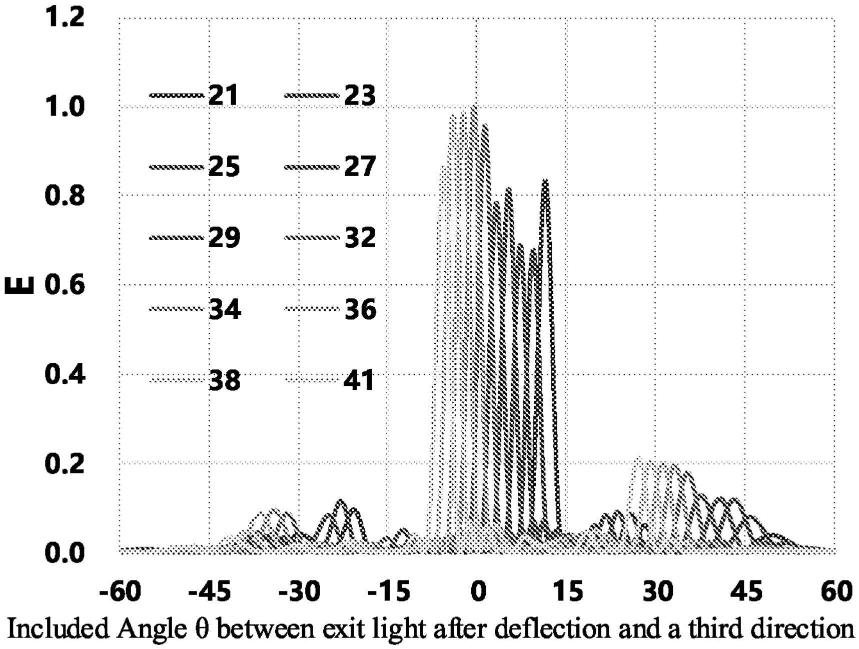
FIG. 17 is a brightness distribution diagram after deflection of the exit light entering the adjacent color film portion, in accordance with some embodiments.

FIG. 16 is a brightness distribution diagram before deflection of the exit light entering the adjacent color film portion 41 in accordance with some embodiments. FIG. 17 is a brightness distribution diagram after deflection of the exit light entering the adjacent color film portion 41 in accordance with some embodiments.

As shown in FIGS. 16 and 17, after modulating the exit light by using the metasurface structure 315E in the above embodiments, the exit light will be deflected. For example, the maximum angle between the exit light entering the adjacent color film portion 41 and the third direction Z may be 21°, and the minimum angle between the exit light entering the adjacent color film portion 41 and the third direction Z may be 41°. The angle of the deflected exit light is approximately in a range of 5° to 15°. It can be seen from FIGS. 16 and 17 that after being modulated by the metasurface structure 315E, the exit light incident on the adjacent color film portion 41 may be 20% of the exit light before deflection. It can be seen that the metasurface structure 315E formed through the above implementation has a deflection effect on large-angle light, so that the exit light entering the another color film portion 41 adjacent to the corresponding color film portion 41 is reduced. Thus, the crosstalk between adjacent color film portions 41 may be reduced, which is beneficial to improving the display contrast of the display module 100.

Figure 18:
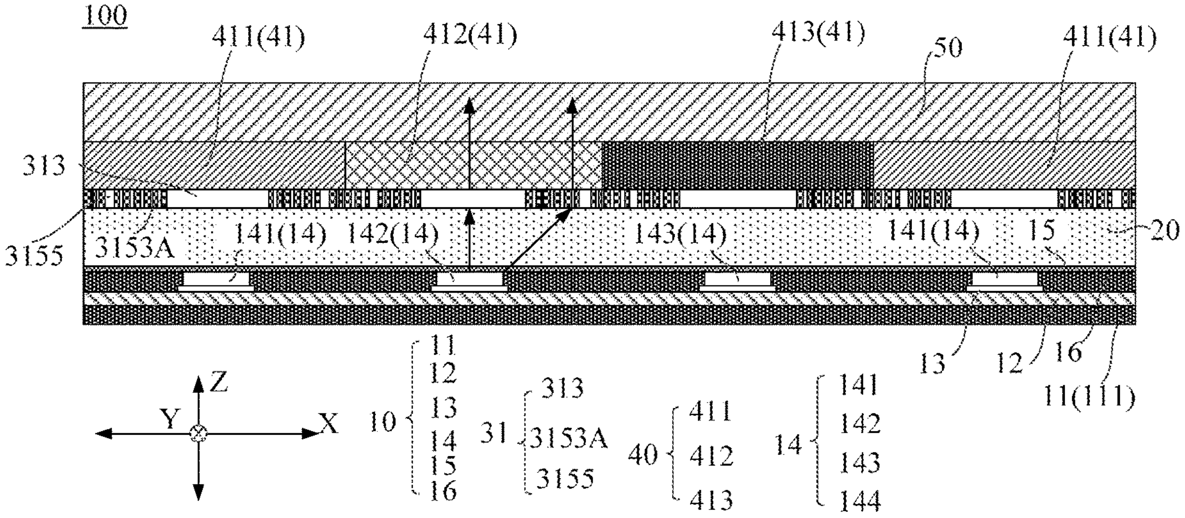
FIG. 18 is a structural diagram of another display module, in accordance with some embodiments.

FIG. 18 is a structural diagram of another display module 100 in accordance with some embodiments. As shown in FIG. 18, in some other embodiments, the plurality of light-emitting portions 14 may be configured to emit light of three primary colors. For example, the light-emitting portions 14 may include first light-emitting portions 141, second light-emitting portions 142 and third light-emitting portions 143. The first light-emitting portion 141 may be configured to emit red light, the second light-emitting portion 142 may be configured to emit green light, and the third light-emitting portion 143 may be configured to emit blue light.

As described in the above embodiments, the first color film portion 411 may be a red color film portion 41, the second color film portion 412 may be a green color film portion 41, and the third color film portion 413 may be a blue color film portion 41. The first light-emitting portion 141 may be arranged opposite to the first color film portion 411, the second light-emitting portion 142 may be arranged opposite to the second color film portion 412, and the third light-emitting portion 143 may be arranged opposite to the third color film portion 413. Through the above provision, the exit light emitted by the light-emitting portions 14 may display a predetermined image through the corresponding color film portions 41.

In some embodiments, in a modulation portion 31 corresponding to the first light-emitting portion 141, the periodic distance P may be equal to half of the wavelength of red light. In a modulation portion 31 corresponding to the second light-emitting portion 142, the periodic distance P may be equal to half of the wavelength of green light. In a modulation portion 31 corresponding to the third light-emitting portion 143, the periodic distance P may be equal to half of the wavelength of blue light.

Here, the term "equal" may include absolute equality and approximate equality. That is, due to certain uncontrollable errors (e.g., manufacturing process errors, equipment accuracy, measurement errors), a difference between the periodic distance P and half of the wavelength of the red light, the green light or the blue light within an acceptable range of deviation may be considered approximately equal. The acceptable range of deviation may be any of 30%, 20%, 10% or 5%.

The design process of the size and position of the unit structure 3153 in the embodiments in which the plurality of light-emitting portions 14 are configured to emit light of three primary colors will be briefly described in the following.

As described in the above embodiments, any unit structure 3153 has a different phase value, and a first column 3153A corresponding to any unit structure 3153 has a different size, that is, the first column 3153A corresponding to any unit structure 3153 has a different radius.

The radius of the first column 3153A corresponding to the unit structure 3153 may be calculated according to the phase value of the unit structure 3153 through formula (2) and formula (3). In formula (2) and formula (3), $\lambda$ is the wavelength of the light from the light-emitting portion 14 corresponding to the unit structure 3153. Since the plurality of light-emitting portions 14 may be configured to emit light of three primary colors, the wavelengths of light from the light-emitting portions 14 corresponding to the unit structures 3153 may include red light, green light and blue light.

Further, the coordinates of the first column 3153A corresponding to the unit structure 3153 may be calculated through formula (4) according to the phase value of the unit structure 3153. In formula (4), $\lambda$ is the wavelength of the light from the light-emitting portion 14 corresponding to the unit structure 3153. Since the plurality of light-emitting portions 14 may be configured to emit light of three primary colors, the wavelengths of light from the light-emitting portions 14 corresponding to the unit structures 3153 may include red light, green light and blue light.

It can be understood that in the embodiments in which the plurality of light-emitting portions 14 are configured to emit light of three primary colors, the same modulation portion 31 has different modulation effects on exit light with different wavelengths. For example, the same modulation portion 31 makes a deflection angle of red light larger, and makes a deflection angle of blue light smaller.

Through the above provision, the modulation portion 31 disposed between the first color film portion 411 and the first light-emitting portion 141 may modulate red light, the modulation portion 31 disposed between the second color film portion 412 and the second light-emitting portion 142 may modulate green light, and the modulation portion 31 disposed between the third color film portion 413 and the third light-emitting portion 143 may modulate blue light.

To sum up, for different light-emitting portions 14, the sizes and positions of the unit structures 3153 are arranged accordingly. During design and arrangement of the plurality of unit structures 3153 in the modulation portion 31 corresponding to the same light-emitting portion 14, for any unit structure 3153, a phase value may be selected within the value range of the phase value of the unit structure 3153. The corresponding equivalent refractive index and radius of the unit structure 3153 may be obtained through formula (2) and formula (3) according to the corresponding phase value, so as to obtain the size of the unit structure 3153. Further, the corresponding coordinates of the unit structure 3153 is obtained through formula (4) according to the corresponding phase value. By analogy, sizes and positions of the plurality of unit structures 3153 may be designed, so as to form the corresponding modulation structure 315 and achieve the corresponding light modulation effect. By analogy, for another light-emitting portion 14, the arrangement and design process of the plurality of unit structures 3153 in the corresponding modulation portion 31 is the same. In this way, the modulation portions 31 corresponding to different light-emitting portions 14 are designed accordingly, so that the modulation portions 31 corresponding to different light-emitting portions 14 also have different modulation effects, which is beneficial to equivalently improving crosstalk effect between any two adjacent color film portions, thereby realizing the uniform display effect of the display module 100.

Figure 19:
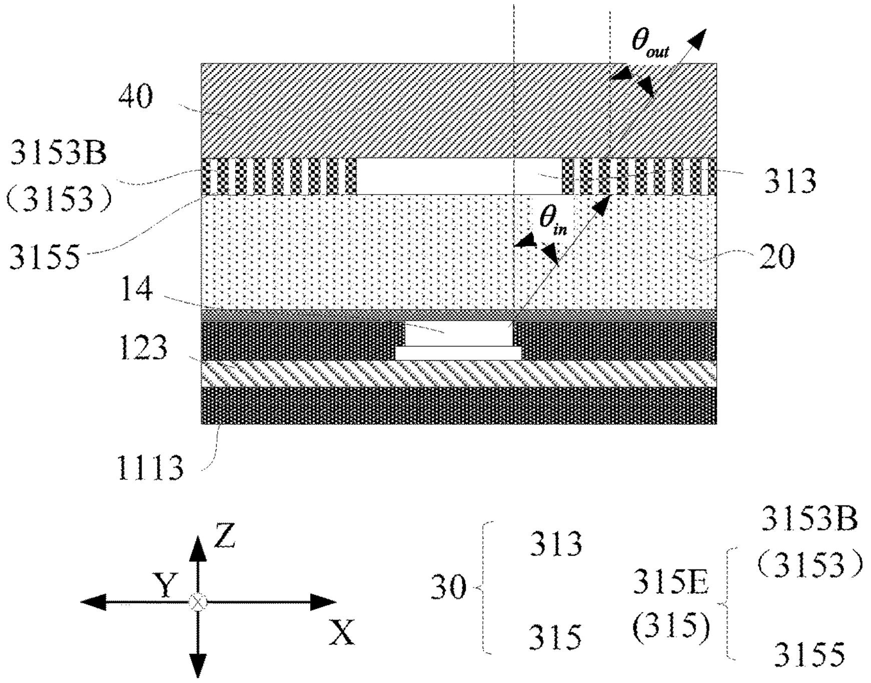
FIG. 19 is a structural diagram of yet another modulation portion, in accordance with some embodiments.
Figure 20:
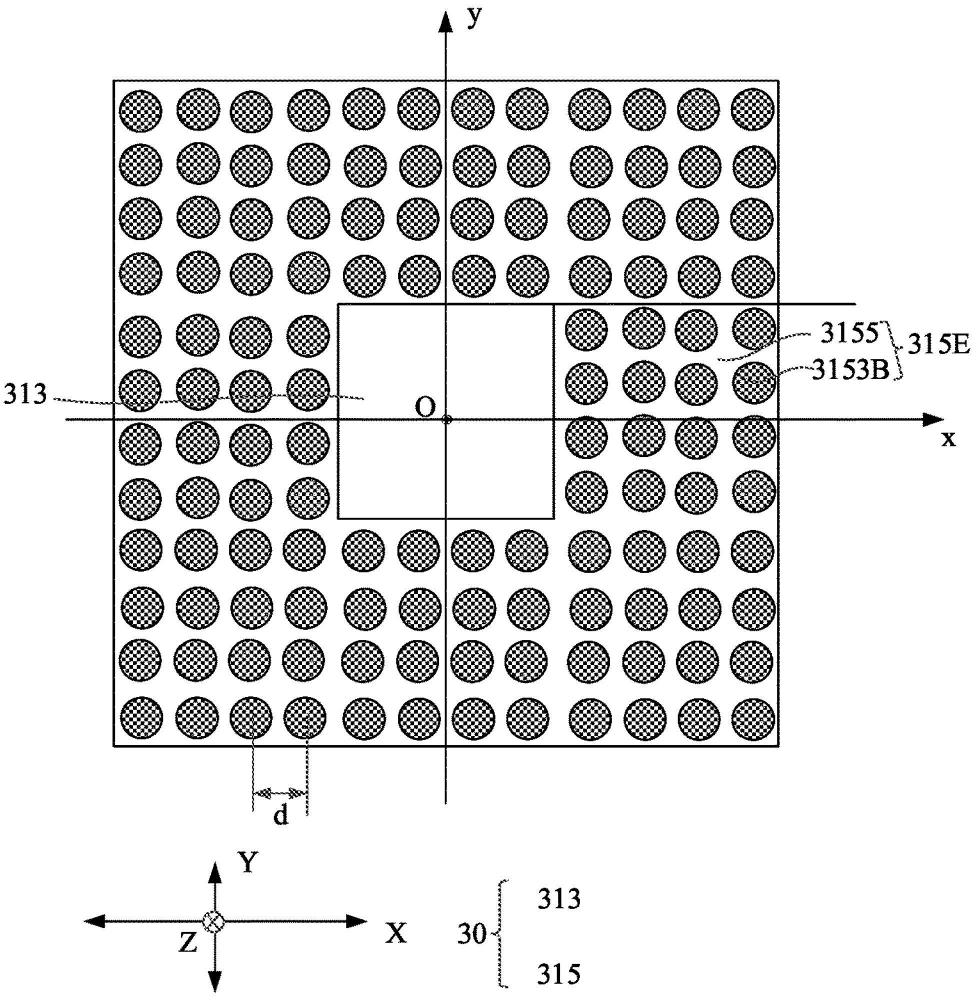
FIG. 20 is a top view of yet another modulation portion, in accordance with some embodiments.

FIG. 19 is a structural diagram of another modulation portion 31 in accordance with some embodiments. FIG. 20 is a top view of another modulation portion 31 in accordance with some embodiments.

In some other embodiments, referring to FIGS. 19 and 20, the plurality of unit structures 3153 have the same phase values. The unit structure 3153 includes a second column 3153B extending in the third direction Z, and a second column 3153B corresponding to any unit structure 3153 has the same size. The third direction Z is perpendicular to the display substrate 10.

As described in the above embodiments, the plurality of unit structures 3153 may be arranged at intervals in a direction parallel to the display substrate 10, and extension directions of the plurality of unit structures 3153 are all perpendicular to the display substrate 10. The unit structure 3153 may be in an order of a small wavelength, and electromagnetic wave modulation of the metasurface structure 315E may be realized through the arrangement design of the unit structures.

For example, since the plurality of unit structures 3153 have the same phase values, second columns 3153B corresponding to the plurality of unit structures 3153 may all have the same sizes. It can be understood that a radius of any second column 3153B also satisfies the above formula (2) and formula (3). It can be seen that the sizes of the second columns 3153B corresponding to the plurality of unit structures 3153 may all be the same, and the equivalent refractive indices of the second columns 3153B corresponding to the plurality of unit structures 3153 are all the same.

For example, the modulation structure 315 may include a plurality of second columns 3153B with the same sizes, and the second columns 3153B are arranged in an array. The center lines of any two adjacent second columns 3153B have an equal distance therebetween. Through the above provision, the center symmetry of the plurality of second columns 3153B may be realized. As described in the above embodiments, an isolation structure 3155 is further provided between adjacent unit structures 3153. All the second columns 3153B and the isolation structure 3155 may constitute a metasurface grating together. The provision of the metasurface grating may achieve the modulation of the exit light from the light-emitting portion 14, so as to converge the exit light, thereby preventing the exit light from entering the another color film portion 41 adjacent to the corresponding color film portion 41. Further, the crosstalk between adjacent color film portions 41 may be reduced, and the contrast of the display module 100 may be improved.

The second column 3153B may be a cylinder; alternatively, the second column 3153B may be another column structure such as a prism, which is not limited in some embodiments of the present disclosure.

It can be understood that in the above embodiments in which the phase values of the plurality of unit structures 3153 are all different, in order to satisfy high phase coverage of the unit structures 3153, a plurality of phase values are selected within the value range of the phase value of the unit structure 3153. Corresponding to different phase values of the plurality of unit structures 3153, the first columns 3153A also include a plurality of different duty ratios. For a first column 3153A with a large radius, a value of the duty ratio of the first column 3153A is large, for example, the value of the duty ratio of the first column 3153A may be close to 1. The first column 3153A with a large duty ratio may be formed with a certain processing difficulty.

Through the above provision, the uniformity of the structure of the modulation portion 31 may be improved. In addition, the manufacturing difficulty of the second column 3153B may be reduced, and thus the manufacturing efficiency of the modulation structure 315 may be reduced.

As mentioned in the above embodiments, the display module 100 further includes the encapsulation layer 20, and the light modulation layer 30 is located between the encapsulation layer 20 and the color film layer 40. Through the above provision, the exit light from the light-emitting portion 14 enters the corresponding modulation structure 315 through the encapsulation layer 20, and after being converged by the corresponding modulation structure 315, the converged exit light is incident on the corresponding color film portion 41.

In some embodiments, the second column 3153B satisfies the following formula (5):

$$d(n_{in}\sin\theta_{in} \pm n_{out}\sin\theta_{out}) = m\lambda. \quad (5)$$

In formula (5), d is a distance between center lines of adjacent unit structures 3153. Any two adjacent unit structures 3153 have an equal distance therebetween. For example, the distance between the center lines of the two second columns 3153B may be close to the wavelength scale.

In formula (5), $n_m$ is a refractive index of the encapsulation layer 20, and $\theta_{in}$ is an angle between the light from the light-emitting portion 14 corresponding to the unit structure 3153 and a normal.

Of course, in some other embodiments, the encapsulation layer 20 may be replaced by another film layer structure. That is, the exit light from the light-emitting portion 14 enters the corresponding modulation structure 315 through another film layer structure. In this case, $n_{in}$ is a refractive index of the another film layer structure.

In the formula (5), $n_{out}$ is a refractive index of the color film portion 41 corresponding to the unit structure 3153, and $\theta_{out}$ is an angle between the light exiting to the corresponding color film portion 41 and the normal.

As described in the above embodiments, the color film portions 41 include the first color film portions 411, the second color film portions 412 and the third color film portions 413 of different colors. In some embodiments, refractive indices corresponding to the first color film portion 411, the second color film portion 412 and the third color film portion 413 are all different.

In formula (5), m is a coefficient and m is equal to 1 (m=1), and λ is the wavelength of light from the light-emitting portion 14 corresponding to the unit structure 3153.

Through the above provision, the distance between the center lines of adjacent unit structures 3153 may be determined. Since the plurality of unit structures 3153 are arranged in an array, the arrangement of the plurality of unit structures 3153 may be determined, that is, coordinates of the plurality of unit structures 3153 may be obtained.

In some embodiments, a ratio of a diameter of the second column 3153B to a distance between center lines of two adjacent unit structures 3153 is in a range of 0.3 to 0.6, inclusive. For example, the ratio of the diameter of the second column 3153B to the distance between the center lines of the two adjacent unit structures 3153 may be 0.3, 0.4, 0.5 or 0.6. The above provision is beneficial to improving the uniformity of the structure of the modulation portion 31. The ratio of the diameter of the second column 3153B to the distance between the center lines of the two adjacent unit structures 3153 approaching 0.3 is beneficial to reducing the manufacturing difficulty of the second column 3153B, thereby further reducing the manufacturing efficiency of the modulation structure 315.

Figure 21:
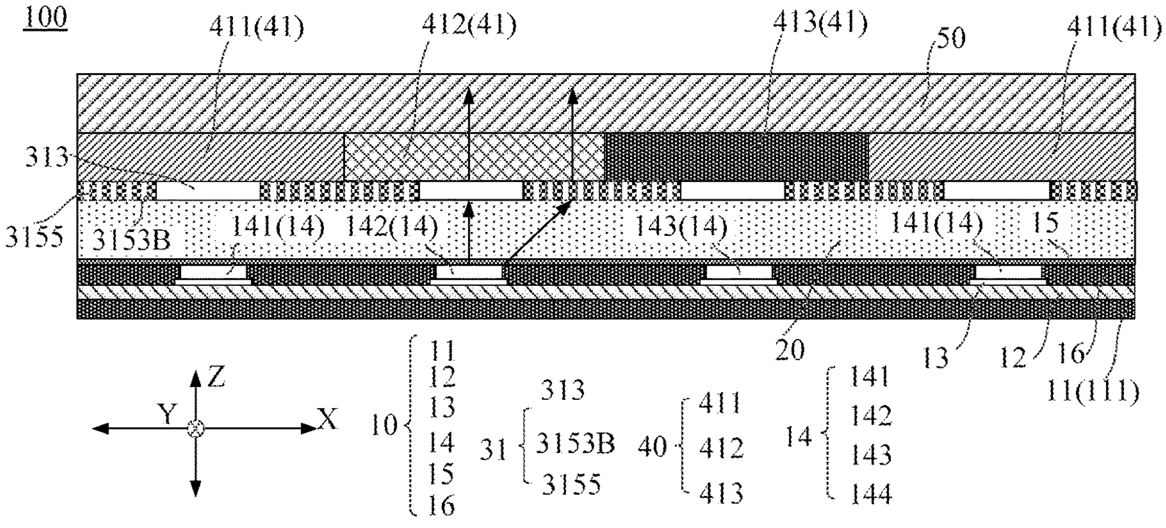
FIG. 21 is a structural diagram of yet another display module, in accordance with some embodiments.

FIG. 21 is a structural diagram of yet another display module 100 in accordance with some embodiments. As shown in FIG. 21, the plurality of light-emitting portions 14 are configured to emit light of three primary colors. For example, the light-emitting portions 14 may include first light-emitting portions 141, second light-emitting portions 142 and third light-emitting portions 143. The first light-emitting portion 141 may be configured to emit red light, the second light-emitting portion 142 may be configured to emit green light, and the third light-emitting portion 143 may be configured to emit blue light.

As described in the above embodiments, the first color film portion 411 may be the red color film portion 41, the second color film portion 412 may be the green color film portion 41, and the third color film portion 413 may be the blue color film portion 41. The first light-emitting portion 141 may be arranged opposite to the first color film portion 411, the second light-emitting portion 142 may be arranged opposite to the second color film portion 412, and the third light-emitting portion 143 may be arranged opposite to the third color film portion 413. Through the above provision, the exit light emitted by the light-emitting portions 14 may display a predetermined image through the corresponding color film portions 41.

That is, in a process of determining the distance between the center lines of adjacent unit structures 3153 according to formula (5), in formula (5), λ is the wavelength of the light from the light-emitting portion 14 corresponding to the unit structure 3153. Since the plurality of light-emitting portions 14 may be configured to emit light of three primary colors, the wavelengths of light from the light-emitting portions 14 corresponding to the unit structures 3153 may include red light, green light and blue light.

Through the above provision, for different light-emitting portions 14, the sizes and positions of the unit structures 3153 are set accordingly, so that the modulation portions 31 corresponding to different light-emitting portions 14 have different modulation effects, which is beneficial to equivalently improving the crosstalk effect between any two adjacent color film portions 41, and is further beneficial to realizing the uniform display effect of the display module 100.

In some embodiments, in the modulation portion 31 corresponding to the first light-emitting portion 141, the periodic distance P may be equal to half of the wavelength of the red light; in the modulation portion 31 corresponding to the second light-emitting portion 142, the periodic distance P may be equal to half of the wavelength of the green light; and in the modulation portion 31 corresponding to the third light-emitting portion 143, the periodic distance P may be equal to half of the wavelength of the blue light.

Here, the term "equal" may include absolute equality and approximate equality. That is, due to certain uncontrollable errors (e.g., manufacturing process errors, equipment accuracy, measurement errors), the difference between the periodic distance P and half of the wavelength of the red light, the green light or the blue light within an acceptable range of deviation may be considered approximately equal. The acceptable range of deviation may be any of 30%, 20%, 10% or 5%.

To sum up, for different light-emitting portions 14, the sizes and positions of the unit structures 3153 are arranged accordingly. During design and arrangement of the plurality of unit structures 3153 in the modulation portion 31 corresponding to the same light-emitting portion 14, for any unit structure 3153, the distance between the center lines of adjacent unit structures 3153 may be obtained through formula (5), and then the corresponding radius is obtained, so that the size of the unit structure 3153 is obtained. Further, the plurality of unit structures 3153 may be arranged according to the distance between the center lines of adjacent unit structures 3153, that is, the coordinates of the plurality of unit structures 3153 may be obtained. By analogy, sizes and positions of the plurality of unit structures 3153 may be designed, so as to form the corresponding modulation structure 315 and achieve the corresponding light modulation effect. By analogy, for another light-emitting portion 14, the arrangement and design process of the plurality of unit structures 3153 in the corresponding modulation portion 31 is the same. In this way, the modulation portions 31 corresponding to different light-emitting portions 14 are designed accordingly, so that the modulation portions 31 corresponding to different light-emitting portions 14 also have different modulation effects, which is beneficial to equivalently improving crosstalk effect between any two adjacent color film portions, thereby realizing the uniform display effect of the display module 100.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:

a display substrate including a plurality of light-emitting portions;

a color film layer located on a light-exit side of the display substrate; wherein the color film layer includes a plurality of color film portions, and the plurality of color film portions cover the plurality of light-emitting portions, respectively; the plurality of color film portions include at least two color film portions of different colors; and a light modulation layer located between the color film layer and the display substrate; wherein the light modulation layer includes a plurality of modulation portions, a modulation portion is correspondingly disposed between a light-emitting portion and a color film portion; the modulation portion includes a modulation structure and a transmission structure; the color film portion includes a first region and a second region; an orthogonal projection of the transmission structure on the corresponding color film portion is located within the first region; the second region is adjacent to another color film portion of a different color, and an orthogonal projection of the modulation structure on the corresponding color film portion is located in the second region; the modulation structure is used to converge exit light from the corresponding light-emitting portion;

wherein the modulation structure includes a metasurface structure; the metasurface structure includes a plurality of unit structures, and the plurality of unit structures are arranged in an array; center lines of any two adjacent unit structures have an equal distance therebetween, and each unit structure has an equal height in a direction perpendicular to the display substrate.

2. The display module according to claim 1, wherein an orthogonal projection of the transmission structure on the display substrate completely covers the corresponding light-emitting portion.

3. The display module according to claim 2, wherein the transmission structure includes a vacuum layer.

4. The display module according to claim 1, wherein an orthogonal projection of the modulation portion on the display substrate coincides with an orthogonal projection of the corresponding color film portion on the display substrate.

5. The display module according to claim 1, wherein the plurality of unit structures are centrally symmetrical.

6. The display module according to claim 1, wherein a material of the unit structure includes silicon nitride.

7. The display module according to claim 1, wherein the metasurface structure further includes an isolation structure; the isolation structure is located between the plurality of unit structures, and a refractive index of the unit structure is greater than a refractive index of the isolation structure.

8. The display module according to claim 7, wherein a difference between the refractive index of the unit structure and the refractive index of the isolation structure is in a range of 1.03 to 1.3, inclusive.

9. The display module according to claim 7, wherein the modulation structure includes a first edge and a second edge that are oppositely disposed; the first edge is disposed proximate to the transmission structure, and the second edge is disposed away from the transmission structure; a distance between the first edge and the second edge is L and satisfies a following formula:

$$L = T2 \times \tan\theta;$$

wherein
- L is the distance between the first edge and the second edge;
- T2 is a thickness of the color film portion corresponding to the modulation structure; and
- θ is an angle at which the modulation structure deflects light from the corresponding light-emitting portion, $\theta = \sin^{-1}(1/n)$, where n is a refractive index of the color film portion corresponding to the modulation structure.

10. The display module according to claim 9, wherein any of the plurality of unit structures has a different phase value; the unit structure includes a first column extending in a third direction, and a first column corresponding to any of the plurality of unit structures has a different size; the third direction intersects with the display substrate.

11. The display module according to claim 10, wherein a phase value of the unit structure is in a range of 0 to 2π(m−1)/m, wherein m is a positive integer.

12. The display module according to claim 11, wherein the first column is a cylinder, and a radius of the first column corresponding to any of the plurality of unit structures satisfies a following formula:

$$n_{eff} = \sqrt{n_1^2 - \left(\frac{U(r, n_2)\lambda}{2\pi r}\right)^2};$$

wherein
- $n_{eff}$ is an equivalent refractive index corresponding to the unit structure, and $$\varphi = \frac{2\pi}{\lambda} n_{eff} H,$$

where φ is a phase value corresponding to the unit structure, H is a height of the unit structure in a direction perpendicular to the display substrate, and λ is a wavelength of light from a light-emitting portion corresponding to the unit structure;
- $U(r,n_2)$ is a Bessel function related to r and $n_2$, r is the radius of the first column corresponding to the unit structure, and $n_3$ is a refractive index of the unit structure; and
- $n_1$ is a refractive index of the isolation structure.

13. The display module according to claim 12, wherein coordinates of the first column corresponding to any of the plurality of unit structures satisfy the following formula:

$$\varphi(x, y) = \frac{2\pi n_2}{\lambda}(x + y)\sin\theta;$$

wherein
- $n_2$ is the refractive index of the unit structure;
- λ is the wavelength of the light from the light-emitting portion corresponding to the unit structure;
- θ is an angle at which the unit structure deflects the light from the corresponding light-emitting portion;
- x is a coordinate value of the unit structure on a first coordinate axis, and the first coordinate axis extends in a first direction; and
- y is a coordinate value of the unit structure on a second coordinate axis, and the second coordinate axis extends in a second direction; a common origin of the first coordinate axis and the second coordinate axis is located at a midpoint of the modulation portion including the unit structure, the first direction and the second direction are both parallel to the display substrate, and the first direction intersects the second direction.

14. The display module according to claim 9, wherein the plurality of unit structures have same phase values; the unit structure includes a second column extending in a third direction, and a second column corresponding to any of the plurality of unit structures has a same size; the third direction intersects with the display substrate.

15. The display module according to claim 14, further comprising an encapsulation layer, wherein the light modulation layer is located between the encapsulation layer and the color film layer; the second column satisfies a following formula:

$$d(n_{in} \sin\theta_{in} \pm n_{out} \sin\theta_{out}) = m\lambda;$$

wherein
- d is a distance between center lines of adjacent unit structures;
- $n_{in}$ is a refractive index of the encapsulation layer, and $\theta_{in}$ is an angle between light from a light-emitting portion corresponding to the unit structure and a normal;
- $n_{out}$ is a refractive index of the color film portion corresponding to the unit structure, and $\theta_{out}$ is an angle between light exiting to the corresponding color film portion and a normal line;
- m is a coefficient, and m=1;
- λ is a wavelength of the light from the light-emitting portion corresponding to the unit structure.

16. The display module according to claim 15, wherein a ratio of a diameter of the second column to the distance between the center lines of two adjacent unit structures is in a range of 0.3 to 0.6, inclusive.

17. The display module according to claim 1, wherein the modulation structure is disposed around the transmission structure.

18. The display module according to claim 17, wherein the modulation structure includes a first sub-portion, a second sub-portion, a third sub-portion, and a fourth sub-portion that are connected end to end in sequence; the first sub-portion and the third sub-portion both extend in a first direction and are arranged opposite to each other in a second direction; the second sub-portion and the fourth sub-portion both extend in the second direction and are arranged opposite to each other in the first direction; and the first direction and the second direction are both parallel to the display substrate, and the first direction intersects the second direction; a width of the first sub-portion in the second direction, a width of the third sub-portion in the second direction, a width of the second sub-portion in the first direction and a width of the fourth sub-portion in the first direction are equal.

19. A display device, comprising the display module according to claim 1.

* * * * *